United States Patent
Kim et al.

(10) Patent No.: US 10,608,141 B2
(45) Date of Patent: Mar. 31, 2020

(54) LIGHT EMITTING DIODE CHIP HAVING ELECTRODE PAD

(71) Applicant: Seoul Viosys Co., Ltd., Ansan-si (KR)

(72) Inventors: Ye Seul Kim, Ansan-si (KR); Kyoung Wan Kim, Ansan-si (KR); Yeo Jin Yoon, Ansan-si (KR); Sang Hyun Oh, Ansan-si (KR); Keum Ju Lee, Ansan-si (KR); Jin Woong Lee, Ansan-si (KR); Da Yeon Jeong, Ansan-si (KR); Sang Won Woo, Ansan-si (KR)

(73) Assignee: SEOUL VIOSYS CO., LTD., Ansan-si (KR)

(*) Notice: Subject to any disclaimer, the term of this patent is extended or adjusted under 35 U.S.C. 154(b) by 0 days.

(21) Appl. No.: 15/936,321

(22) Filed: Mar. 26, 2018

(65) Prior Publication Data

US 2018/0219130 A1    Aug. 2, 2018

Related U.S. Application Data

(63) Continuation of application No. 15/336,510, filed on Oct. 27, 2016, now Pat. No. 9,929,314, which is a
(Continued)

(30) Foreign Application Priority Data

| Nov. 18, 2010 | (KR) | 10-2010-0114747 |
| Nov. 18, 2010 | (KR) | 10-2010-0114748 |
| Dec. 31, 2014 | (KR) | 10-2014-0195165 |

(51) Int. Cl.
*H01L 33/36* (2010.01)
*H01L 33/62* (2010.01)
(Continued)

(52) U.S. Cl.
CPC .............. *H01L 33/36* (2013.01); *H01L 33/08* (2013.01); *H01L 33/20* (2013.01); *H01L 33/38* (2013.01);
(Continued)

(58) Field of Classification Search
CPC ....... H01L 33/62; H01L 33/145; H01L 33/38; H01L 33/42; H01L 33/36; H01L 33/382; H01L 33/385
See application file for complete search history.

(56) References Cited

U.S. PATENT DOCUMENTS 6,573,537 B1    6/2003  Steigerwald et al.
9,520,536 B2 *  12/2016 Kim ........................ H01L 33/20
(Continued)

FOREIGN PATENT DOCUMENTS

| JP | 200456109 | 2/2004 |
| JP | 2006256606 | 9/2006 |

(Continued)

OTHER PUBLICATIONS

Korean Intellectual Property Office, Korean Patent Application No. 10-2010-0114747, Notification of Reason for Refusal, Nov. 1, 2016, 5 pages, 10-2010-0114748.

*Primary Examiner* — Feifei Yeung Lopez
(74) *Attorney, Agent, or Firm* — Perkins Coie LLP

(57) ABSTRACT

Disclosed herein is an LED chip including electrode pads. The LED chip includes a semiconductor stack including a first conductive type semiconductor layer, a second conductive type semiconductor layer on the first conductive type semiconductor layer, and an active layer interposed between the first conductive type semiconductor layer and the second conductive type semiconductor layer; a first electrode pad located on the second conductive type semiconductor layer opposite to the first conductive type semiconductor layer; a
(Continued)

first electrode extension extending from the first electrode pad and connected to the first conductive type semiconductor layer; a second electrode pad electrically connected to the second conductive type semiconductor layer; and an insulation layer interposed between the first electrode pad and the second conductive type semiconductor layer. The LED chip includes the first electrode pad on the second conductive type semiconductor layer, thereby increasing a light emitting area.

19 Claims, 21 Drawing Sheets

Related U.S. Application Data continuation of application No. 14/984,829, filed on Dec. 30, 2015, now Pat. No. 9,520,536, which is a continuation-in-part of application No. 14/630,273, filed on Feb. 24, 2015, now Pat. No. 9,397,264, which is a continuation of application No. 13/885,777, filed as application No. PCT/KR2011/011385 on Feb. 28, 2011, now Pat. No. 8,987,772.

(51) Int. Cl.
| | |
|---|---|
| *H01L 33/38* | (2010.01) |
| *H01L 33/20* | (2010.01) |
| *H01L 33/42* | (2010.01) |
| *H01L 33/46* | (2010.01) |
| *H01L 33/08* | (2010.01) |

(52) U.S. Cl.
CPC .......... *H01L 33/382* (2013.01); *H01L 33/385* (2013.01); *H01L 33/42* (2013.01); *H01L 33/46* (2013.01); *H01L 33/62* (2013.01)

(56) References Cited

U.S. PATENT DOCUMENTS

| | | | |
|---|---|---|---|
| 2002/0123164 | A1 | 9/2002 | Slater |
| 2002/0139987 | A1 | 10/2002 | Collins |
| 2003/0230754 | A1* | 12/2003 | Steigerwald ............ H01L 33/08 257/91 |
| 2007/0145380 | A1 | 6/2007 | Shum |
| 2007/0246716 | A1 | 10/2007 | Bhal |
| 2009/0159909 | A1 | 6/2009 | Lee |
| 2009/0283787 | A1* | 11/2009 | Donofrio .............. H01L 33/405 257/98 |
| 2010/0117111 | A1 | 5/2010 | Illek |
| 2012/0049756 | A1 | 3/2012 | Schubert |

FOREIGN PATENT DOCUMENTS

| | | |
|---|---|---|
| JP | 2007273975 | 10/2007 |
| JP | 2008108905 | 5/2008 |
| JP | 2008210900 | 9/2008 |
| JP | 2009033157 | 2/2009 |
| JP | 201056195 | 3/2010 |
| JP | 2010525585 | 7/2010 |
| JP | 2010192167 | 9/2010 |
| KR | 1020080072555 | 8/2008 |
| KR | 1020100016631 | 2/2010 |
| WO | 2008131736 | 11/2008 |

\* cited by examiner

LIGHT EMITTING DIODE CHIP HAVING ELECTRODE PAD

CROSS-REFERENCE TO RELATED APPLICATION(S)

This patent document is a continuation of U.S. patent application Ser. No. 15/336,510, filed Oct. 27, 2016, which is a continuation of U.S. patent application Ser. No. 14/984,829, filed Dec. 30, 2015, issued as U.S. Pat. No. 9,520,536 on Dec. 13, 2016, which is a continuation-in-part of U.S. patent application Ser. No. 14/630,273, filed on Feb. 24, 2015, issued as U.S. Pat. No. 9,397,264 on Jul. 19, 2016, which claims the benefits and priorities to U.S. patent application Ser. No. 13/885,777, filed on May 16, 2013, issued as U.S. Pat. No. 8,987,772 on Mar. 24, 2015, which is the National Stage entry of International Application PCT/KR2011/001385, filed on Feb. 28, 2011, which further claims priorities from and the benefits of Korean Patent Application No. 10-2010-0114747, filed on Nov. 18, 2010, Korean Patent Application No. 10-2010-0114748, filed on Nov. 18, 2010. This patent document also claims the benefits and priority to Korean Patent Application No. 10-2014-0195165, filed on Dec. 31, 2014. The above applications are all hereby incorporated by reference for all purposes as if fully set forth herein.

TECHNICAL FIELD

The disclosed technology relates to a light emitting diode chip and, more particularly, to a light emitting diode chip having electrode pads.

BACKGROUND

Gallium nitride (GaN) based light emitting diodes (LEDs) have been used in a wide range of applications including natural color LED displays, LED traffic lights, white LEDs, etc. In recent years, a highly efficient white LED is expected to replace fluorescent lamps and, in particular, efficiency of the white LED approaches efficiency of typical fluorescent lamps.

The GaN-based LED is generally formed by growing epitaxial layers on a substrate, for example, a sapphire substrate, and includes an n-type semiconductor layer, a p-type semiconductor layer and an active layer interposed between the n-type semiconductor layer and the p-type semiconductor layer. Further, an n-electrode pad is formed on the n-type semiconductor layer and a p-electrode pad is formed on the p-type semiconductor layer. The LED is electrically connected to and operated by an external power source through these electrode pads. Here, electric current is directed from the p-electrode pad to the n-electrode pad through the semiconductor layers.

To assist current spreading in the LED, the LED includes extensions extending from the electrode pads. For example, U.S. Pat. No. 6,650,018 discloses an LED which includes a plurality of extensions extending in opposite directions from electrode contact portions, that is, electrode pads to enhance current spreading. The use of the extensions extending from the electrode pads may result in improvement in efficiency of the LED through current spreading.

However, an n-electrode pad and n-electrode extensions are generally formed on the n-type semiconductor layer exposed by etching the p-type semiconductor layer and the active layer. Accordingly, the formation of the n-electrode pad and the n-electrode extensions results in a reduction in light emitting area, causing deterioration in light emitting efficiency.

Meanwhile, since the electrode pads and the electrode extensions are formed of metal, the electrode pads and the electrode extensions absorb light generated in the active layer, thereby causing optical loss. Further, although the use of the electrode extensions enhances current spreading, current crowding still occurs at regions near the electrode extensions, causing electrode extension induced optical loss. In addition, since the electrode pads and the electrode extensions use a material such as Cr, which exhibits low reflectivity, as an underlying layer, optical loss becomes severe due to optical absorption by bottom portions of the electrode pads and/or the electrode extensions.

Furthermore, as the size of the LED increases, the likelihood of a defect being present in the LED increases. For example, defects such as threading dislocations and pinholes, provide a path through which electric current flows rapidly, thereby disturbing current spreading in the LED Moreover, when a large LED of 1 mm$^2$ is operated at a current of about 200 mA or more, the current crowds through such defects or through a certain position and the LED suffers a severe reduction in external quantum efficiency relating to current density, which is referred to as a droop phenomenon.

SUMMARY

Exemplary embodiments of the disclosed technology provide light emitting diode chips configured to prevent a reduction in light emitting area resulting from formation of electrode pads and/or electrode extensions.

Exemplary embodiments of the disclosed technology provide light emitting diode chips which permit uniform current spreading over a wide area by relieving current crowding near electrode pads and electrode extensions.

Exemplary embodiments of the disclosed technology provide light emitting diode chips capable of preventing optical loss due to electrode pads and electrode extensions.

Exemplary embodiments of the disclosed technology provide light emitting diode chips that may prevent current crowding at a certain position during operation at high current, thereby enhancing external quantum efficiency.

In accordance with one aspect, a light emitting diode (LED) chip includes: a semiconductor stack including a first conductive type semiconductor layer, a second conductive type semiconductor layer on the first conductive type semiconductor layer, and an active layer interposed between the first conductive type semiconductor layer and the second conductive type semiconductor layer; a first electrode pad located on the second conductive type semiconductor layer opposite to the first conductive type semiconductor layer; a first electrode extension extending from the first electrode pad and connected to the first conductive type semiconductor layer; a second electrode pad electrically connected to the second conductive type semiconductor layer; and an insulation layer interposed between the first electrode pad and the second conductive type semiconductor layer. Since the first electrode pad is located on the second conductive type semiconductor layer, it is possible to prevent a reduction in light emitting area due to the formation of the first electrode pad.

The LED chip may further include a substrate and the semiconductor stack may be located on the substrate. In this case, the first conductive type semiconductor layer is located closer to the substrate than the second conductive type semiconductor layer. In addition, the second electrode pad may also be located on the second conductive type semiconductor layer.

The insulation layer may include a distributed Bragg reflector. A reflector may also be interposed between the insulation layer and the second conductive type semiconductor layer. The reflector may be a distributed Bragg reflector or a metal reflector.

In some exemplary embodiments, a transparent conductive layer may be interposed between the insulation layer and the second conductive type semiconductor layer. The transparent conductive layer under the insulation layer assists supply of electric current to the active layer under the insulation layer. Alternatively, the reflector may be in direct contact with the second conductive type semiconductor layer under the first electrode pad, thereby reducing optical loss by the transparent conductive layer.

In some exemplary embodiments, the LED chip may further include a dot pattern interposed between the first electrode extension and the first conductive type semiconductor layer along the first electrode extension such that the first electrode extension is partially separated from the first conductive type semiconductor layer by the dot pattern. The dot pattern may relieve current crowding around the first electrode extension and permits current spreading over a wider area.

The dot pattern may be formed of an insulation material. The dot pattern may include a reflector, for example, a metal reflector or a distributed Bragg reflector.

In some exemplary embodiments, the semiconductor stack may further include a plurality of through-holes extending through the second conductive type semiconductor layer and the active layer to expose the first conductive type semiconductor layer. The plurality of through-holes may be arranged along the first electrode extension and the first electrode extension may be connected to the first conductive type semiconductor layer through the through-holes.

Since the first electrode extension is connected to the first conductive type semiconductor layer through the through-holes, it is possible to achieve current spreading over a wide area by relieving current crowding around the first electrode extension.

An insulation layer may be interposed between the first electrode extension and the second conductive type semiconductor layer, so that the first electrode extension may be insulated from the second conductive type semiconductor layer by the insulation layer.

In addition, the insulation layer under the first electrode extension may extend to a sidewall of the through-holes to insulate the first electrode extension from the sidewall of the through-holes.

The insulation layer under the first electrode extension may include a distributed Bragg reflector. In addition, the distributed Bragg reflector under the first electrode extension may extend to a sidewall of the through-holes to insulate the first electrode extension from the sidewall of the through-holes.

In some exemplary embodiments, the LED chip may further include a transparent conductive layer interposed between the insulation layer under the first electrode extension and the second conductive type semiconductor layer. The transparent conductive layer allows electric current to be supplied to the active layer under the first electrode extension.

In other exemplary embodiments, the insulation layer may be in direct contact with the second conductive type semiconductor layer under the first electrode extension. In other words, the transparent conductive layer is not located under the first electrode extension, thereby preventing optical loss due to the transparent conductive layer.

The LED chip may further include a second electrode extension extending from the second electrode pad, and a transparent conductive layer located on the second conductive type semiconductor layer. The second electrode pad and the second electrode extension may be electrically connected to the second conductive type semiconductor layer through the transparent conductive layer.

In some exemplary embodiments, a current blocking layer may be interposed between the transparent conductive layer and the second conductive type semiconductor layer along the second electrode extension. The current blocking layer may be arranged in a line shape or in a dot pattern. With this structure, it is possible to relieve current crowding around the second electrode extension.

In addition, the current blocking layer may include a reflector. Therefore, it is possible to prevent light directed towards the second electrode extension from being absorbed and lost into the second electrode extension.

In other exemplary embodiments, the current blocking layer may be arranged in a dot pattern between the transparent conductive layer and the second electrode extension along the second electrode extension. The second electrode extension is connected to the second conductive type semiconductor layer through the transparent conductive layer between the dot regions.

Further, an exemplary embodiment of the invention provides an LED chip that has a dot pattern of contact regions at which the first electrode extension and/or second electrode extension are electrically connected to the semiconductor stack to permit current spreading over a wide area of the LED chip.

For example, the first electrode extension may be connected to the first conductive type semiconductor layer in a plurality of dot regions. Here, the plurality of dot regions may include first dot regions closer to the first electrode pad than the second electrode pad and second dot regions closer to the second electrode pad than the first electrode pad. In addition, the first dot regions may increase in size as the distance between the first dot regions and the first electrode pads increases. Further, the second dot regions may decrease in size as the distance between the second dot regions and the first electrode pad increases.

The LED chip may further include a second electrode extension extending from the second electrode pad; and a transparent conductive layer interposed between the second electrode extension and the second conductive type semiconductor layer. In addition, the second electrode extension may be connected to the second conductive type semiconductor layer through the transparent conductive layer in a plurality of dot regions, and the plurality of dot regions arranged along the second electrode extension may include third dot regions closer to the second electrode pad than the first electrode pad and fourth dot regions closer to the first electrode pad than the second electrode pad. The third dot regions may increase in size as the distance between the third dot regions and the second electrode pad increases. Further, the fourth dot regions may decrease in size as the distance between the fourth dot regions and the second electrode pad increases.

In addition, the first to fourth dot regions may increase in size as the distance from the first to fourth dot regions to a line crossing the first electrode pad and the second electrode pad increases.

In accordance with another aspect, an LED chip includes: a first conductive type semiconductor layer; a plurality of mesa structures arranged on the first conductive type semiconductor layer and each including a second conductive type semiconductor layer and an active layer interposed between the first conductive type semiconductor layer and the second conductive type semiconductor layer; a first electrode pad, at least a part of which is located on the second conductive type semiconductor layer opposite to the first conductive type semiconductor layer; a first electrode extension extending from the first electrode pad and connected to the first conductive type semiconductor layer; a second electrode pad electrically connected to the second conductive type semiconductor layer; and an insulation layer interposed between the first electrode pad and the second conductive type semiconductor layer. Since the first electrode pad is formed on the second conductive type semiconductor layer, it is possible to prevent a reduction in light emitting area due to the formation of the first electrode pad. Further, since the LED chip employs the plurality of mesa structures, the LED chip may achieve current spreading to the plurality of mesa structures and prevent a rapid increase in current density in a certain position of the LED chip, thereby improving external quantum efficiency.

The LED chip may further include a substrate and the first conductive type semiconductor layer may be located on the substrate. In this case, the first conductive type semiconductor layer is located closer to the substrate than the second conductive type semiconductor layer. In addition, the second electrode pad may also be located on the second conductive type semiconductor layer.

The second electrode pad may include a plurality of electrode pads located on the plurality of mesa structures, respectively. In addition, the first electrode pad may include a plurality of electrode pads located on the plurality of mesa structures, respectively.

The plurality of mesa structures may be separated from each other by a separation region exposing the first conductive type semiconductor layer. As a result, a surface of the first conductive type semiconductor layer is exposed at the separation region.

In an exemplary embodiment, the first electrode extension may include an electrode extension connected to the first conductive type semiconductor layer in the separation region. In addition, a dot pattern may be interposed between the electrode extension and the first conductive type semiconductor layer along the electrode extension in the separation region to partially separate the electrode extension from the first conductive type semiconductor layer. The dot pattern may be formed of an insulation material and may include a distributed Bragg reflector. The dot pattern may relieve current crowding around the electrode extension and permit current spreading over a wider area.

The insulation layer interposed between the first electrode pad and the second conductive type semiconductor layer may include a distributed Bragg reflector. Further, a reflector may be interposed between the insulation layer and the second conductive type semiconductor layer. The reflector may be a distributed Bragg reflector or a metal reflector.

Further, the first electrode pad may include an electrode pad partially located in the separation region.

In some exemplary embodiments, a transparent conductive layer may be interposed between the insulation layer and the second conductive type semiconductor layer. The transparent conductive layer under the insulation layer assists supply of electric current to the active layer under the insulation layer. Alternatively, the reflector may be in direct contact with the second conductive type semiconductor layer in a region under the first electrode pad, thereby reducing optical loss by the transparent conductive layer.

Each of the mesa structures may include a plurality of through-holes extending through the second conductive type semiconductor layer and the active layer to expose the first conductive type semiconductor layer. Further, the first electrode extension may include an electrode extension connected to the first conductive type semiconductor layer through the plurality of through-holes. The plurality of through-holes is arranged along the electrode extension. Since the electrode extension is connected to the first conductive type semiconductor layer through the through-holes, it is possible to achieve current spreading over a wider area by relieving current crowding around the electrode extension.

In addition, an insulation layer is interposed between the second conductive type semiconductor layer and the electrode extension connected to the first conductive type semiconductor layer through the plurality of through-holes. The electrode extension may be insulated from the second conductive type semiconductor layer by the insulation layer.

Further, the insulation layer interposed between the electrode extension and the second conductive type semiconductor layer may include a distributed Bragg reflector. With this structure, it is possible to prevent optical loss of light generated in the mesa structure by the electrode extension.

Further, the insulation layer interposed between the electrode extension and the second conductive type semiconductor layer may extend to a sidewall of the through-holes to insulate the first electrode extension from the sidewall of the through-holes.

In addition, a transparent conductive layer may be interposed between the insulation layer under the electrode extension and the second conductive type semiconductor layer. The transparent conductive layer may assist supply of electric current to the active layer under the electrode extension. Alternatively, the insulation layer may be in direct contact with second conductive type semiconductor layer under the electrode extension. In other words, the transparent conductive layer is not located under the electrode extension, thereby reducing optical loss by the transparent conductive layer.

The LED chip may further include a second electrode extension extending from the second electrode pad; and a transparent conductive layer formed on the second conductive type semiconductor layer. The second electrode pad and the second electrode extension may be electrically connected to the second conductive type semiconductor layer through the transparent conductive layer.

In some exemplary embodiments, a current blocking layer may be interposed between the transparent conductive layer and the second conductive type semiconductor layer along the second electrode extension. The current blocking layer may be arranged in a line shape or in a dot pattern. With this structure, it is possible to relieve current crowding around the second electrode extension. The current blocking layer may further be disposed under the second electrode pad.

In addition, the current blocking layer may include a reflector, for example, a distributed Bragg reflector. Therefore, it is possible to prevent light directed towards the second electrode extension from being absorbed and lost into the second electrode extension.

In other exemplary embodiments, the current blocking layer may be arranged in a dot pattern between the transparent conductive layer and the second electrode extension along the second electrode extension. The second electrode extension is connected to the second conductive type semiconductor layer through the transparent conductive layer between the dots.

According to exemplary embodiments, an LED chip includes an electrode pad formed on a semiconductor stack, thereby preventing a reduction in light emitting area due to the formation of the electrode pad. In addition, electrode extensions are connected to a semiconductor layer via through-holes, thereby preventing a reduction in light emitting area due to the formation of the electrode extension.

Further, the first electrode extension may be connected to the semiconductor layer in dot regions, thereby relieving current crowding around the electrode extension while achieving current spreading over a wide area. Furthermore, a current blocking layer is disposed under a second electrode pad and second electrode extensions, thereby relieving current crowding around the second electrode pad and second electrode extensions.

Moreover, reflectors are disposed between semiconductor stacks and the electrode pad and/or the electrode extensions, thereby preventing optical loss due to the electrode pad and/or the electrode extension. In addition, a light emitting region is divided by a plurality of mesa structures, thereby preventing a reduction in external quantum efficiency under high current due to current crowding at a certain position.

Exemplary embodiments of the disclosed technology provide a light emitting diode capable of preventing current crowding around an electrode pad.

In accordance with one aspect, a light emitting diode includes: a light emitting structure including a first conductive-type semiconductor layer, a second conductive-type semiconductor layer located on the first conductive-type semiconductor layer, and an active layer interposed between the first conductive-type semiconductor layer and the second conductive-type semiconductor layer; a transparent conductive layer formed on the second conductive-type semiconductor layer; a second electrode pad formed on the transparent conductive layer; a second electrode extension extending from the second electrode pad; and a current blocking layer interposed between the transparent conductive layer and the second conductive-type semiconductor layer, wherein the transparent conductive layer has one or more holes formed therein, the one or more holes exposing at least a portion of the current blocking layer, and a portion of the second electrode extension is formed on the transparent conductive layer and the other portion of the second electrode extension is formed above the current blocking layer exposed through the holes.

In accordance with another aspect, a light emitting diode device is provided to include a light emitting structure including a first conductive-type semiconductor layer, a second conductive-type semiconductor layer located over the first conductive-type semiconductor layer, and an active layer interposed between the first conductive-type semiconductor layer and the second conductive-type semiconductor layer; a transparent conductive layer formed over the second conductive-type semiconductor layer; a second electrode pad formed over the transparent conductive layer; a second electrode extension extending from the second electrode pad; and a current blocking layer interposed between the transparent conductive layer and the second conductive-type semiconductor layer, wherein the transparent conductive layer has an opening exposing at least a portion of the current blocking layer, and the second electrode extension includes a first portion electrically connected to the transparent conductive layer and a second portion electrically insulated from the transparent conductive layer.

The hole may have a width smaller than that of the current blocking layer. The transparent conductive layer has one or more additional openings that are formed along the second electrode extension and spaced apart from one another. The first portion of the second electrode extension is located on the transparent current blocking layer, and the second portion of the second electrode extension is located on the current blocking layer exposed through the opening of the transparent conductive layer.

The light emitting diode may further include a protective insulation layer covering the transparent conductive layer so that the second electrode extension is insulated from the transparent conductive layer; a first electrode pad located on the second conductive-type semiconductor layer so as to be opposite to the first conductive-type semiconductor layer; and a first electrode extension extending from the first electrode pad and connected to the first conductive-type semiconductor layer.

The light emitting structure may have a groove penetrating through the second conductive-type semiconductor layer and the active layer to expose the first conductive-type semiconductor layer, and the first electrode extension may be connected to the first conductive-type semiconductor layer through the grooves.

The light emitting structure has one or more additional grooves that are arranged along the first electrode extension.

The first electrode extension and the second electrode extension may be disposed in parallel with each other, and the one or more holes may be disposed to be mismatched with the one or more grooves and may be formed at a length at which they are not overlapped with positions of the grooves.

The first electrode extension may be formed along an edge of the light emitting diode device, and the transparent conductive layer may include a metal oxide.

In another aspect, a light emitting diode device is provided to comprise: a substrate having first and second edge that oppose to each other; a light emitting structure including a first conductive-type semiconductor layer formed over the substrate, a second conductive-type semiconductor layer formed over the first conductive-type semiconductor layer; and an active layer interposed between the first conductive-type semiconductor layer and the second conductive-type semiconductor layer; a first electrode pad formed over the light emitting structure around the first edge of the substrate; a first electrode extension extending from the first electrode pad; a second electrode pad formed over the light emitting structure around the second edge of the substrate; and a second electrode extension extending from the second electrode pad, wherein along the first electrode extension, first openings are located spaced apart from one another to connect the first electrode extension to the first conductive-type semiconductor layer, and along the second electrode extension, second openings are located spaced apart from one another to cause a current block in the openings and a current crowd between the openings.

In some implementations, the substrate includes a sapphire substrate. In some implementations, the first openings penetrate through the active layer and the second conductive-type semiconductor layer. In some implementations, the light emitting diode device further comprises a transparent conductive layer located over the second conductivity-type semiconductor layer and having a first portion electrically connected to the second electrode extension and a second portion electrically insulated from the second electrode extension. In some implementations, the light emitting diode device further comprises a current blocking layer located between the second conductivity-type semiconductor layer and the second electrode extension. In some implementations, the light emitting diode device further comprises a protective insulation layer covering the transparent conductive layer. In some implementations, the first openings and the second openings are positioned on different horizontal lines from each other. In some implementations, the second openings have a width greater than that of the second electrode extension.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION

Figure 1:
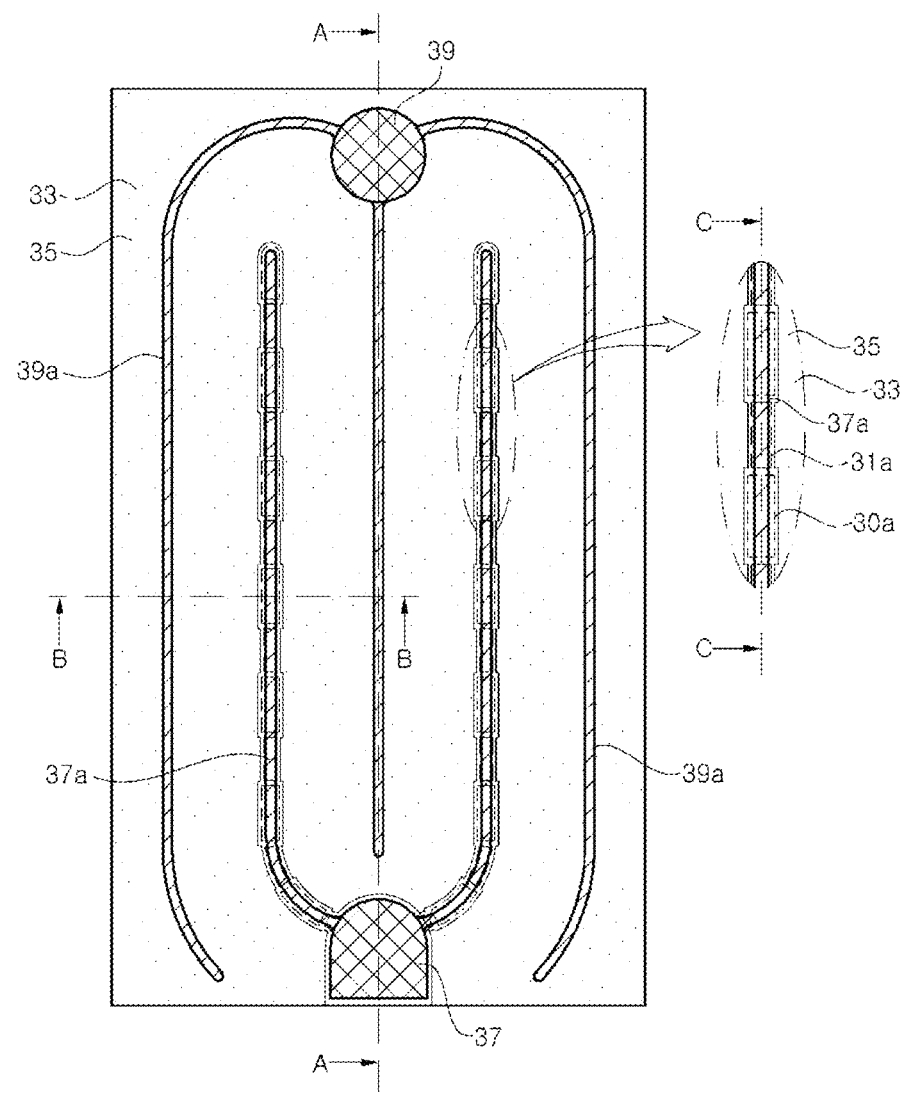
FIG. 1 is a schematic plan view of an LED chip according to one exemplary embodiment of the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2A:
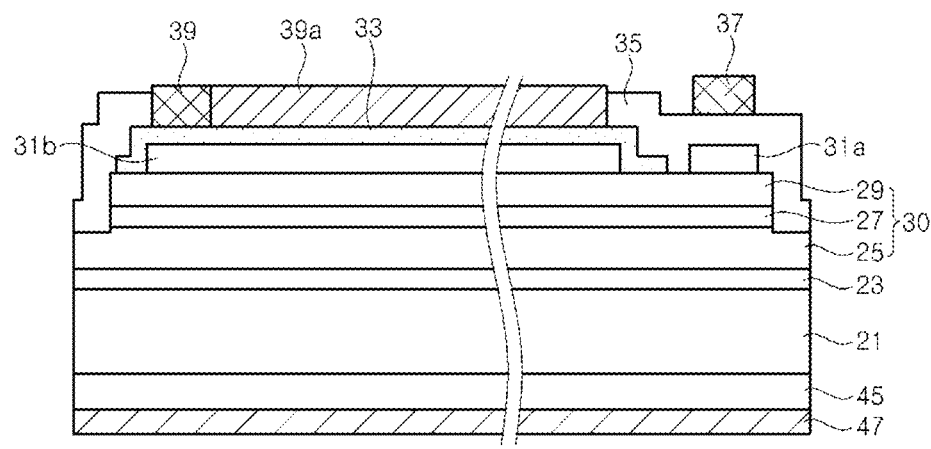
FIGS. 2a, 2b and 2c are sectional views taken along lines A-A, B-B and C-C of FIG. 1, respectively.
Figure 2B:
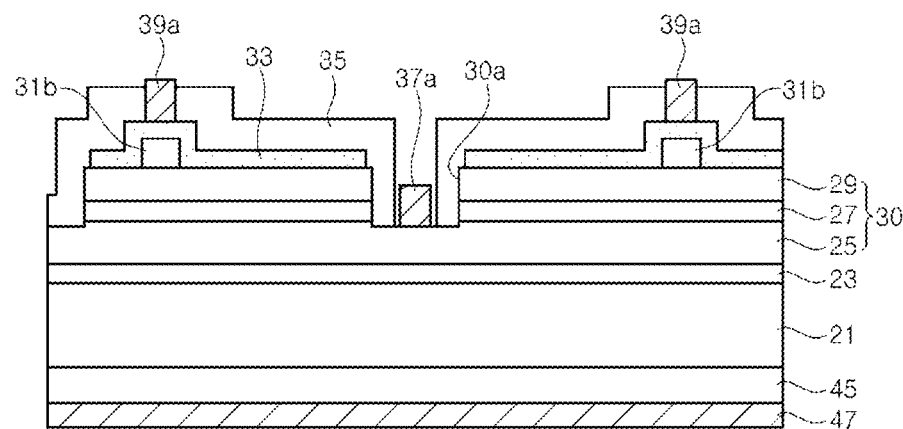
Figure 2C:
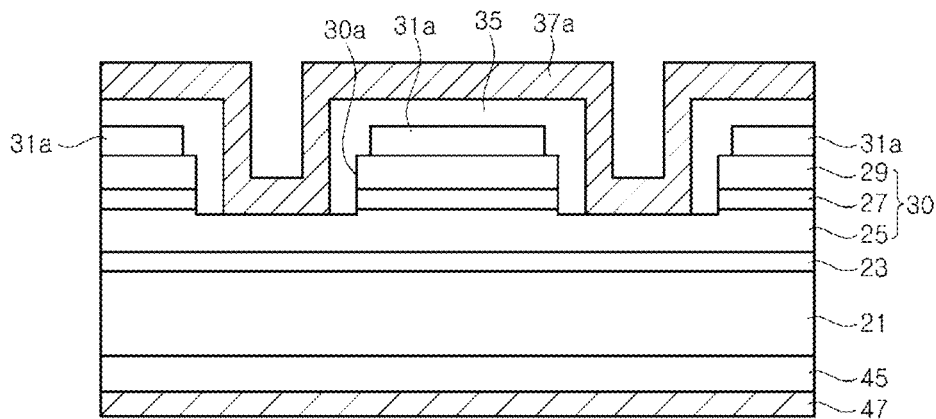

FIG. 1 is a schematic plan view of an LED chip according to one exemplary embodiment of the invention, and FIGS. 2a, 2b and 2c are sectional views taken along lines A-A, B-B and C-C of FIG. 1, respectively.

Referring to FIGS. 1, 2a, 2b and 2c, the LED chip may include a semiconductor stack 30, a first electrode pad 37, a second electrode pad 39, first electrode extensions 37a, second electrode extensions 39a, and a protective insulation layer 35. The LED chip may further include a substrate 21, a buffer layer 23, a first functional layer 31a, a second functional layer 31b, a transparent conductive layer 33, a lower reflector 45, and a metal layer 47. The semiconductor stack 30 may include a first conductive type semiconductor layer 25, an active layer 27, and a second conductive type semiconductor layer 29.

The substrate 21 may be, for example, a sapphire substrate, a SiC substrate or a Si substrate, but is not limited thereto. The substrate 21 may be a growth substrate for growing a gallium nitride based compound semiconductor layer thereon.

The first conductive type semiconductor layer 25 is located on the substrate 21 and the second conductive type semiconductor layer 29 is located on the first conductive type semiconductor layer 25 with the active layer 27 interposed between the first and second conductive type semiconductor layers. The first conductive type semiconductor layer 25, active layer 27 and second conductive type semiconductor layer 29 may be formed of, but are not limited to, a GaN-based compound semiconductor material such as (Al, In, Ga)N. The active layer 27 is composed of elements to emit light at desired wavelengths, for example, UV or visible light.

The first conductive type semiconductor layer 25 may be an n-type nitride semiconductor layer and the second conductive type semiconductor layer 29 may be a p-type nitride semiconductor layer, or vice versa.

The first conductive type semiconductor layer 25 and/or the second conductive type semiconductor layer 29 may have a single layer structure or a multilayer structure. Further, the active layer 27 may have a single quantum well structure or a multi-quantum well structure. The light emitting diode may further include a buffer layer 23 such as GaN or AlN between the substrate 21 and the first conductive type semiconductor layer 25. These semiconductor layers 25, 27, 29 may be formed by metal organic chemical vapor deposition (MOCVD) or molecular beam epitaxy (MBE).

The semiconductor stack 30 has a plurality of through-holes 30*a* extending through the second conductive type semiconductor layer 29 and the active layer 27 to expose the first conductive type semiconductor layer 25. The plurality of through-holes 30*a* is linearly arranged along first electrode extensions 37*a*, as shown in FIG. 1.

The transparent conductive layer 33 may be formed on the second conductive type semiconductor layer 29. The transparent conductive layer 33 may be formed of indium tin oxide (ITO) or Ni/Au and forms an ohmic contact with the second conductive type semiconductor layer 29.

As clearly shown in FIG. 2*a*, the first electrode pad 37 is located on the second conductive type semiconductor layer 29 of the semiconductor stack 30. The first electrode extensions 37*a* extend from the first electrode pad 37. The first electrode pad 37 is insulated from the semiconductor stack 30 and electrically connected to the first conductive type semiconductor layer 25 through the first electrode extensions 37*a*. The first electrode extensions 37*a* are connected to the first conductive type semiconductor layer 25 exposed through the plurality of through-holes 30*a*.

The second electrode pad 39 may be located on the transparent conductive layer 33 and second electrode extensions 39*a* may extend from the second electrode pad 39. The second electrode pad 39 and the second electrode extensions 39*a* may be connected to the transparent conductive layer 33.

Meanwhile, a protective insulation layer 35 is located on the semiconductor stack 30 to cover the semiconductor stack 30. The protective insulation layer 35 may cover the transparent conductive layer 33. In addition, the protective insulation layer 35 is interposed between the first electrode pad 37 and the second conductive type semiconductor layer 29 to separate the first electrode pad 37 from the second conductive type semiconductor layer 29, and between the first electrode extensions 37*a* and the second conductive type semiconductor layer 29 to separate the first electrode extensions 37*a* from the second conductive type semiconductor layer 29. Further, the protective insulation layer 35 covers side walls of the plurality of through-holes 30*a* to insulate the first electrode extensions 37*a* from the side-walls.

The first functional layer 31*a* may be interposed in a pattern of dots between the protective insulation layer 35 and the second conductive type semiconductor layer 29 under the first electrode pad 37 and the first electrode extensions 37*a*. The first functional layer 31*a* may be a reflector having a reflectivity of 50% or more, for example, a distributed Bragg reflector. The distributed Bragg reflector may be formed by alternately stacking insulation layers having difference indices of refraction, for example, $SiO_2$/$TiO_2$ or $SiO_2$/$Nb_2O_5$. When the first functional layer 31*a* constitutes the reflector having a reflectivity of 50% or more, the first functional layer 31*a* may reflect light directed towards the first electrode pad 37 and the first electrode extensions 37*a*, thereby reducing optical loss. In addition, when the first functional layer 31*a* constitutes the distributed Bragg reflector, both the first functional layer 31*a* and the protective insulation layer 35 may serve to insulate the first electrode pad 37 from the semiconductor stack 30.

Further, the second functional layer 31*b* may be located between the transparent conductive layer 33 and the second conductive type semiconductor layer 29. The second functional layer 31*b* may be restrictively located under the second electrode pad 39 and the second electrode extensions 39*a*, and the transparent conductive layer 33 is connected to the second conductive type semiconductor layer 29 while covering the second functional layer 31*b*.

The second functional layer 31*b* may serve as a current blocking layer and/or a reflector. For example, the second functional layer 31*b* may be formed of an insulation material and shield electric current which flows from the second electrode pad 39 and the second electrode extensions 39*a* to the second conductive type semiconductor layer 29 directly disposed under the second functional layer 31*b* through the transparent conductive layer 33. As a result, the second functional layer 31*b* relieves current crowding around the second electrode pad 39 and the second electrode extensions 39*a*, thereby enhancing current spreading. The second functional layer 31*b* may also be formed of a reflector having a reflectivity of 50% or more. Here, the reflector may include a metal reflector or a distributed Bragg reflector. For example, when the second functional layer 31*b* constitutes a distributed Bragg reflector formed by alternately stacking insulation layers having different indices of refraction, the second functional layer 31*b* may serve as both the current blocking layer and the reflector. Furthermore, the second functional layer 31*b* may be formed of the same material as that of the first functional layer 31*a*.

The lower reflector 45 may be a distributed Bragg reflector. The lower distributed Bragg reflector 45 is formed by alternately stacking insulation materials having different indices of refraction and exhibits a relatively high reflectivity, preferably a reflectivity of 90% or more, not only with respect to light in a blue wavelength range, for example, light generated in the active layer 27, but also with respect to light in a yellow wavelength range or in a green and/or red wavelength range. In addition, the lower distributed Bragg reflector 45 may have a reflectivity of 90% or more in a wavelength range of, for example 400-700 nm.

The lower distributed Bragg reflector 45 having a relatively high reflectivity over a wide wavelength range is formed by controlling the optical thickness of each of the material layers repeatedly stacked one above another. The lower distributed Bragg reflector 45 may be formed, for example, by alternately stacking a first $SiO_2$ layer and a second $TiO_2$ layer, or by alternately stacking a first $SiO_2$ layer and a second $Nb_2O_5$ layer. Since $Nb_2O_5$ exhibits a lower optical absorption rate than $TiO_2$, it is more advantageous that the lower distributed Bragg reflector 45 is formed by alternately stacking the first $SiO_2$ layer and the second $Nb_2O_5$ layer. As the number of first and second layers increases, the distributed Bragg reflector 45 exhibits more stable reflectivity. For example, the distributed Bragg reflector 40 may be composed of fifty or more layers, that is, 25 pairs or more.

It is not necessary for the first layers or second layers to have the same thickness. The thickness of the first layers or the second layers is selected to provide relatively high reflectivity not only with respect to light generated in the active layer 27 but also with respect to light having different wavelengths in the visible spectrum. Further, the lower distributed Bragg reflector 45 may be formed by stacking a plurality of distributed Bragg reflectors exhibiting high reflectivity in different wavelength ranges.

The use of the distributed Bragg reflector 45 in the LED chip results in reflection and discharge not only of light generated in the active layer 27 but also of external light entering the substrate 21.

Further, the metal layer 47 may be located under the lower distributed Bragg reflector 45. The metal layer 47 may be formed of a reflective metal such as aluminum to reflect light passing through the lower distributed Bragg reflector 45. Of course, the metal layer 47 may be formed of other metals instead of the reflective metal. Moreover, the metal layer 47 assists dissipation of heat from the stack 30, thereby enhancing heat dissipation of the LED chip 102.

In the present embodiment, the first electrode pad 37 is located above the second conductive type semiconductor layer 29 of the semiconductor stack 30. Accordingly, there is no need to etch the second conductive type semiconductor layer 29 and the active layer 27 to form the first electrode pad 37, thereby preventing a reduction in light emitting area. In addition, since the first electrode extensions 37a are connected to the first conductive type semiconductor layer 25 through the plurality of through-holes 30a, it is possible to relieve a reduction in the light emitting area due to the formation of the first electrode extensions 37a. Furthermore, since first electrode extensions 37a are connected in the dot pattern to the first conductive type semiconductor layer 25 instead of being continuously connected thereto, it is possible to relieve current crowding around the first electrode extensions 37a.

Next, a method of fabricating the LED chip will be described.

First, epitaxial layers 25, 27, 29 are grown on a substrate 21. A buffer layer 23 may be further formed before forming the epitaxial layers. Then, a second conductive type semiconductor layer 29 and an active layer 27 are patterned to form a semiconductor stack 30 having a mesa structure. At this time, a plurality of through-holes 30a is also formed therein.

Then, a first functional layer 31a and a second functional layer 31b are formed on the second conductive type semiconductor layer 29. The first functional layer 31a may be formed in a dot pattern on a region to be formed with a first electrode pad 37 and on regions of the second conductive type semiconductor layer between the plurality of through-holes 30a. The second functional layer 31b is formed along regions where a second electrode pad 39 and second electrode extensions 39a will be formed. Both the first functional layer 31a and the second functional layer 31b may be formed of an insulation material or a reflective material. Further, the first and second functional layers 31a and 31b may be formed as distributed Bragg reflectors. The first and second functional layers 31a, 31b may be formed before the formation of the semiconductor stack 30 of the mesa structure.

Then, a transparent conductive layer 33 is formed. The transparent conductive layer 33 is connected to the second conductive type semiconductor layer 29 and covers the second functional layer 31b. At this time, the first functional layer 31a is exposed, instead of being covered with the transparent conductive layer 33.

Then, a protective insulation layer 35 is formed to cover the transparent conductive layer 33, the first functional layer 31a and the plurality of through-holes 30a. Meanwhile, the protective insulation layer 35 in the plurality of through-holes 30a is etched to expose the first conductive type semiconductor layer 25. In addition, the protective insulation layer 35 above the second functional layer 31b is etched to expose the transparent conductive layer 33.

Next, the first electrode pad 37, the second electrode pad 39, first electrode extensions 37a and second electrode extensions 39a are formed. The first electrode pad 37 is formed on the protective insulation layer 35 and may be formed above the first functional layer 31a. Meanwhile, the first electrode extensions 37a covers the plurality of through-holes 30a, which are linearly arranged, and are connected to the first conductive type semiconductor layer 25. Further, the second electrode pad 39 and the second electrode extensions 39a are formed on the transparent conductive layer 33 above the second functional layer 31b.

Then, a lower reflector 45 and a metal layer 47 are formed under the substrate 21, and then the substrate 21 is divided into individual LED chips, thereby finishing preparation of the LED chips.

Figure 3:
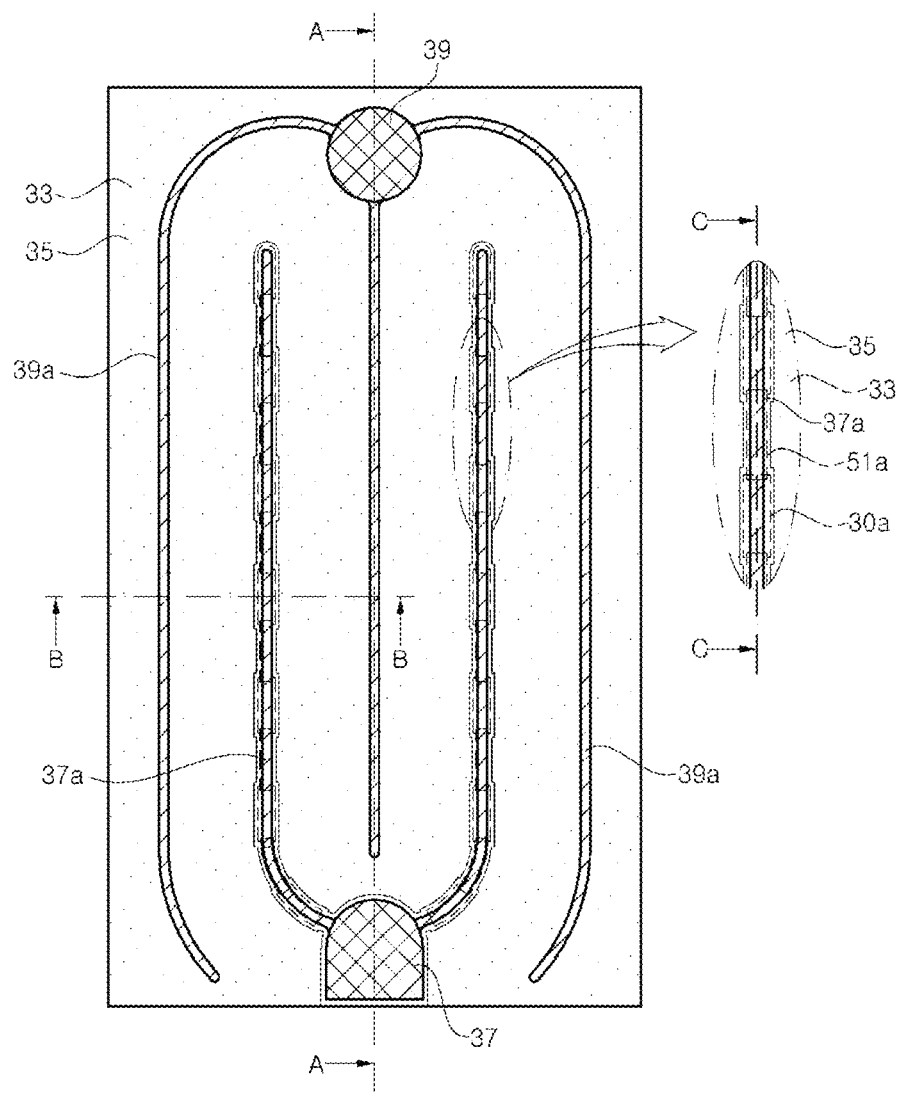
FIG. 3 is a schematic plan view of an LED chip according to another exemplary embodiment of the invention.
Figure 4A:
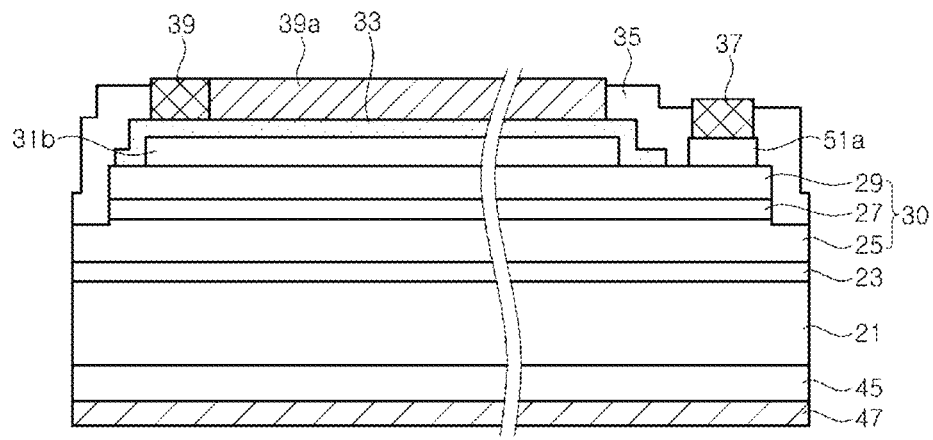
FIGS. 4a, 4b and 4c are sectional views taken along lines A-A, B-B and C-C of FIG. 3, respectively.
Figure 4B:
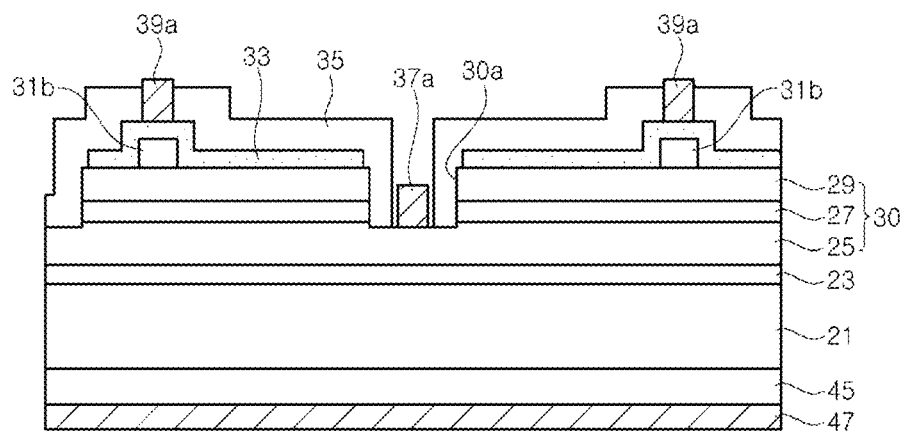
Figure 4C:
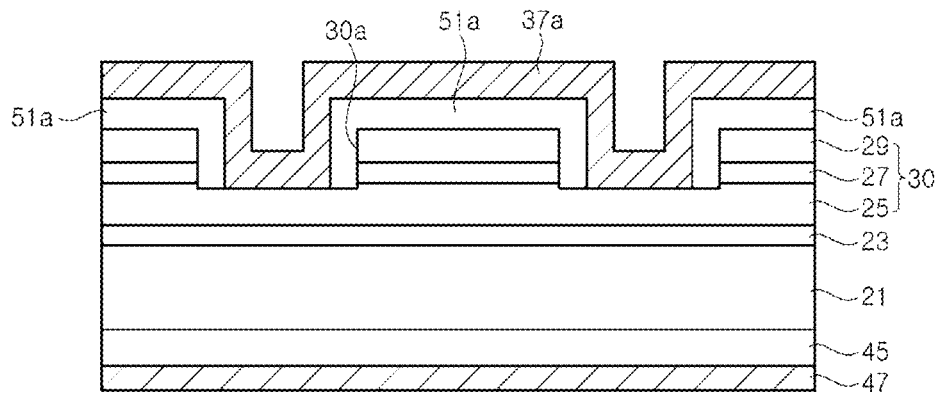

FIG. 3 is a schematic plan view of an LED chip according to another exemplary embodiment of the invention, and FIGS. 4a, 4b and 4c are sectional views taken along lines A-A, B-B and C-C of FIG. 3, respectively.

Referring to FIGS. 3, 4a, 4b and 4c, the LED chip according to this embodiment is generally similar to the LED chip of the above embodiment, and detailed descriptions of the same components will thus be omitted herein.

Referring to FIG. 4a, a first electrode pad 37 is formed on a first functional layer 51a. In other words, the protective insulation layer 35 between the first electrode pad 37 and the first functional layer 51a is eliminated in this embodiment. Further, the protective insulation layer 35 between the first electrode extensions 37a and the semiconductor stack 30 is also eliminated in this embodiment. Herein, the first functional layer 51a is formed of an insulation material and may constitute a distributed Bragg reflector. A second functional layer 31b may be formed of the same material as that of the first functional layer 51a by the same process.

Meanwhile, the first electrode extensions 37a in a plurality of through-holes 30a are separated from sidewalls in the through-holes 30a by the first functional layer 51a. Specifically, the first functional layer 51a located on the second conductive type semiconductor layer 29 in regions between the plurality of through-holes 30a extends into the plurality of through-holes 30a and covers the sidewalls of the through-holes 30a. Meanwhile, some of the sidewalls, that is, sidewalls located at opposite sides of the first electrode extensions 37a in the plurality of through-holes 30a, may be covered with the protective insulation layer 35.

In the above embodiment, openings formed on the protective insulation layer 35 include regions exposing the transparent conductive layer 33 and regions exposing the first conductive type semiconductor layer in the plurality of through-holes 30a. Among these regions, the regions exposing the transparent conductive layer 33 correspond to regions at which the second electrode pad 39 and the second electrode extensions 39a are formed, but the regions exposing the first conductive type semiconductor layer do not correspond to the first electrode pad 37 and the first electrode extensions 37a. Accordingly, when the first and second electrode pads 37, 39 and the first and second electrode extensions 37a, 39a are simultaneously formed by lift-off, a pattern of openings is first formed on the protective insulation layer 35 using a photomask, and the first and second electrode pads 37, 39 and the first and second electrode extensions 37a, 39a are formed using another photomask.

According to the present embodiment, however, since the shapes of the first and second electrode pads 37, 39 and the shapes of the first and second electrode extensions 37a, 39a correspond to the pattern of openings formed on the protective insulation layer 35, the first and second electrode pads 37, 39 and the first and second electrode extensions 37a, 39a may be formed using the same photomask as that used to pattern the protective insulation layer 35. In addition, after forming the pattern of openings on the protective insulation layer 35 using a photoresist, the photoresist may be continuously used to form the first and second electrode pads 37, 39 and the first and second electrode extensions 37a, 39a. Accordingly, it is possible to reduce the number of photomasks for fabrication of LED chips, so that the number of photolithography and developing processes for forming the photoresist pattern can be reduced.

Figure 5A:
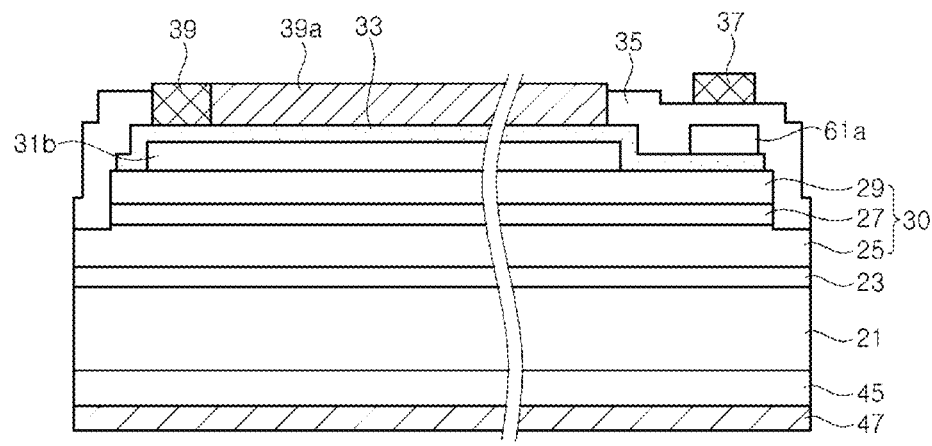
FIGS. 5a, 5b and 5c are sectional views of an LED chip according to a further exemplary embodiment of the invention, respectively.
Figure 5B:
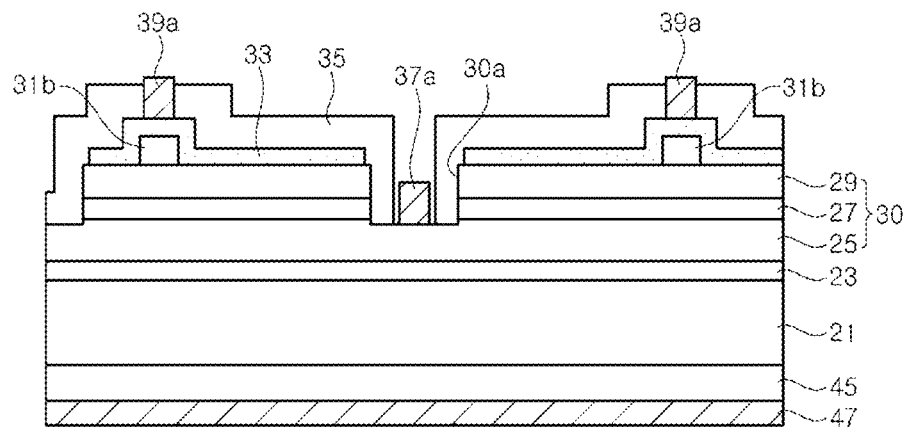
Figure 5C:
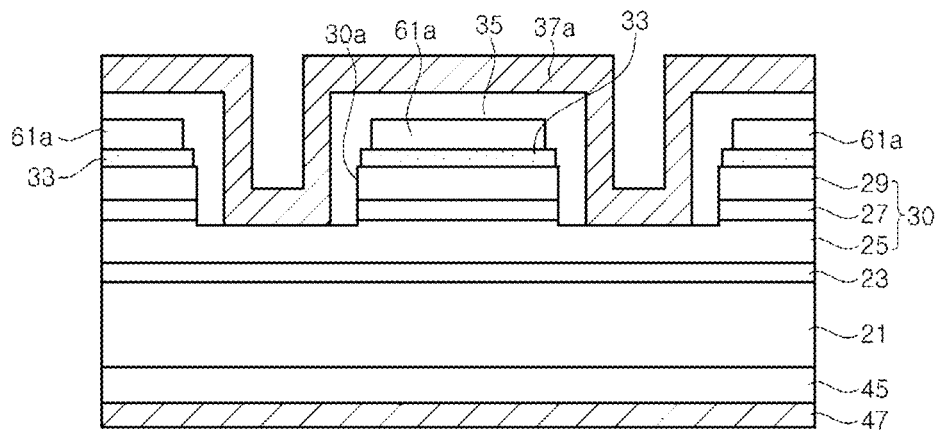

FIGS. 5a, 5b and 5c are sectional views of an LED chip according to a further exemplary embodiment of the invention. The respective figures correspond to sectional views taken along lines A-A, B-B and C-C of FIG. 1.

Referring to FIGS. 5a, 5b and 5c, the LED chip according to this embodiment is generally similar to the LED chip described with reference to FIGS. 1 and 2. In this embodiment, however, a transparent conductive layer 33 extends to a region between a first electrode pad 37 and a second conductive type semiconductor layer 29 and to regions between first electrode extensions 37a and the second conductive type semiconductor layer 29.

Specifically, in the previous embodiments, the transparent conductive layer 33 is not formed on regions of the second conductive type semiconductor layer 29 under the first electrode pad 37 and the first electrode extensions 37a, whereas the transparent conductive layer 33 is also formed on these regions in this embodiment. Since the transparent conductive layer 33 is connected to the second conductive type semiconductor layer 29 under the first electrode pad 37 and the first electrode extensions 37a, electric current can be supplied to the semiconductor stack 30 in these regions.

The first electrode pad 37 and the first electrode extensions 37a are insulated from the transparent conductive layer 33 by the protective insulation layer 35, and a first functional layer 61a may be located between the protective insulation layer 35 and the transparent conductive layer 33.

In this embodiment, the first functional layer 61a and a second functional layer 31b are formed by separate processes. Specifically, after the transparent conductive layer 33 is formed to cover the second functional layer 31b, the first functional layer 61a is formed again on the transparent conductive layer 33.

Figure 6A:
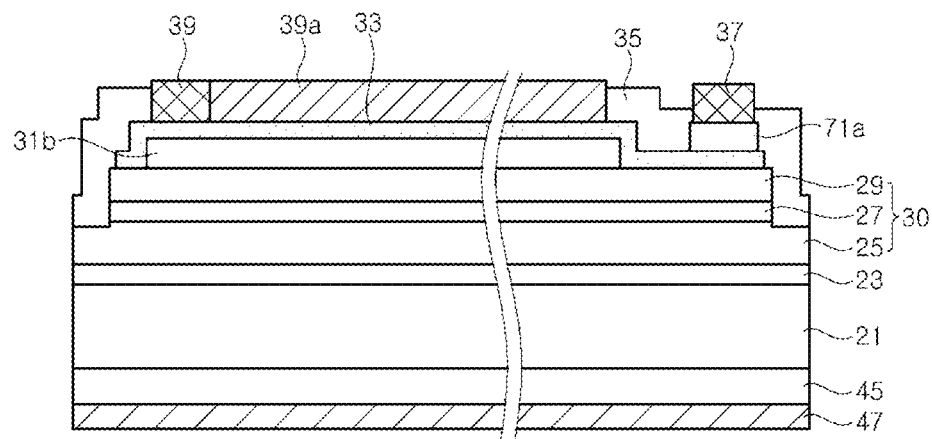
FIGS. 6a, 6b and 6c are sectional views of an LED chip according to yet another exemplary embodiment of the invention.
Figure 6B:
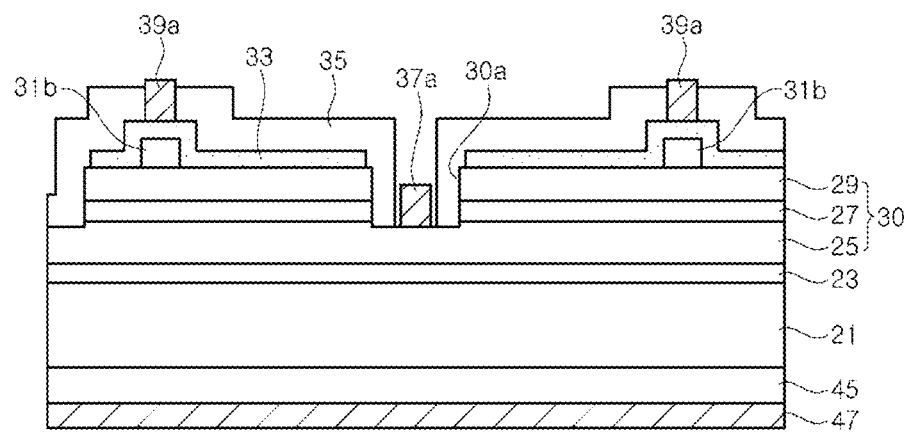
Figure 6C:
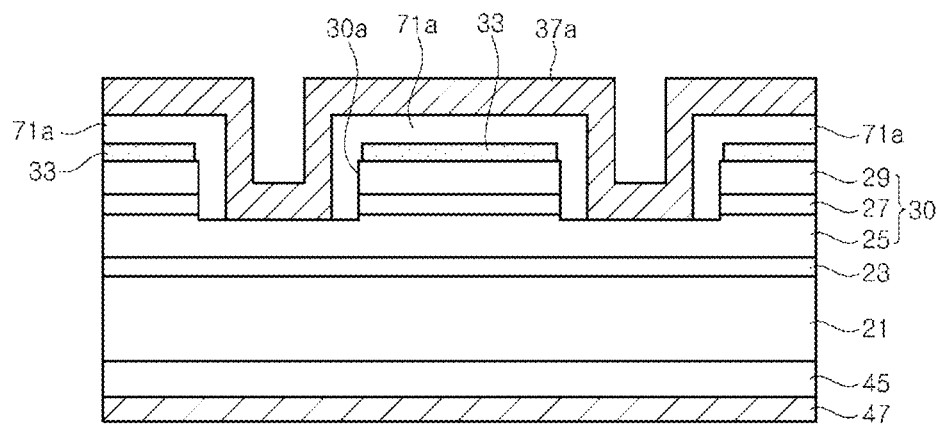

FIGS. 6a, 6b and 6c are sectional views of an LED chip according to yet another exemplary embodiment of the invention. The respective figures correspond to sectional views taken along lines A-A, B-B and C-C of FIG. 3.

Referring to FIGS. 6a, 6b and 6c, the LED chip of this embodiment is generally similar to the LED chip described with reference to FIGS. 3 and 4. In this embodiment, however, a transparent conductive layer 33 extends to a region between a first electrode pad 37 and a second conductive type semiconductor layer 29 and to regions between first electrode extensions 37a and the second conductive type semiconductor layer 29.

Specifically, in the embodiment of FIG. 3, the transparent conductive layer 33 is not formed on regions of the second conductive type semiconductor layer 29 under the first electrode pad 37 and the first electrode extensions 37a, whereas the transparent conductive layer 33 is located on these regions in the present embodiment. Since the transparent conductive layer 33 is connected to the region of the second conductive type semiconductor layer 29 under the first electrode pad 37 and the first electrode extensions 37a, electric current can be supplied to the semiconductor stack 30 in these regions.

The first electrode pad 37 and the first electrode extensions 37a are insulated from the transparent conductive layer 33 by a first functional layer 71a.

In this embodiment, the first functional layer 71a and a second functional layer 31b are formed by separate processes. Specifically, after the transparent conductive layer 33 is formed to cover the second functional layer 31b, the first functional layer 71a is formed again on the transparent conductive layer 33.

Figure 7:
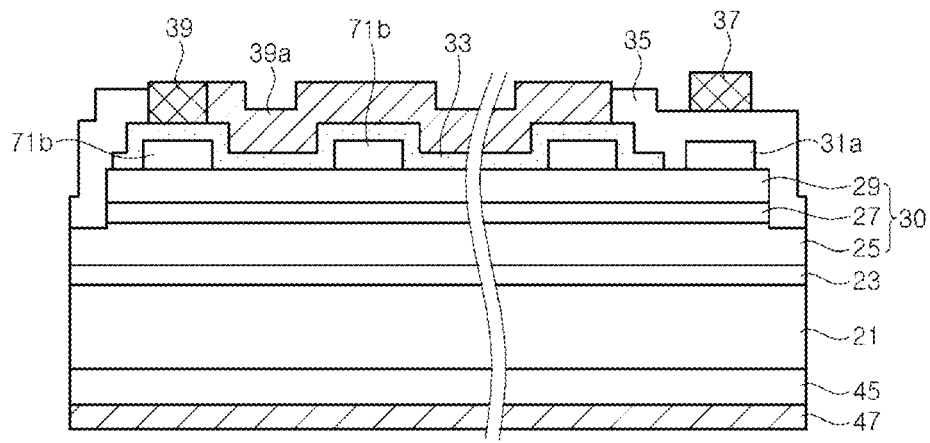
FIG. 7 is a sectional view of an LED chip according to yet another exemplary embodiment of the invention.

FIG. 7 is a sectional view of an LED chip according to yet another exemplary embodiment of the invention.

Referring to FIG. 7, the LED chip according to this embodiment is generally similar to the LED chip described with reference to FIGS. 1 and 2. In this embodiment, however, a second functional layer 71b is arranged in a pattern of dots along a second electrode pad 39 and second electrode extensions 39a.

Specifically, the second functional layer 71b is arranged in the pattern of dots instead of being lineally arranged. In this embodiment, the transparent conductive layer 33 covers the second functional layer 71b and is connected to the second conductive type semiconductor layer 29 in regions between the dots.

Arrangement of the second functional layer 71b in the dot pattern may be applied not only to the embodiment shown in FIGS. 1 and 2, but also to the embodiments shown in FIGS. 3 to 6.

Figure 8:
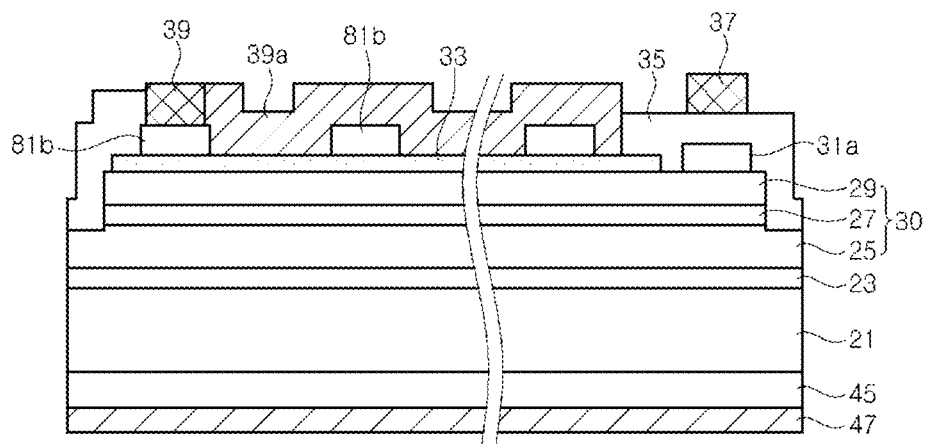
FIG. 8 is a sectional view of an LED chip according to yet another exemplary embodiment of the invention.

FIG. 8 is a sectional view of an LED chip according to yet another exemplary embodiment of the invention.

Referring to FIG. 8, the LED chip according to this embodiment is generally similar to the LED chip described with reference to FIGS. 1 and 2. In this embodiment, however, a second functional layer 81b is arranged in a pattern of dots along a second electrode pad 39 and second electrode extensions 39a on a transparent conductive layer 33.

Specifically, the second functional layer 81b is arranged in the pattern of dots between a transparent conductive layer 33 and a second electrode pad 30 and between the transparent conductive layer 33 and the second electrode extensions 39a. The second electrode extensions 39a are connected to the transparent conductive layer 33 in regions between the dots.

The second functional layer 81b according to this embodiment may be applied not only to the exemplary embodiment shown in FIGS. 1 and 2, but also to the exemplary embodiments shown in FIGS. 3 to 6. Furthermore, when the second functional layer 81b is applied to the exemplary embodiments of FIGS. 5 and 6, the first functional layers 61a, 71a and the second functional layer 81b may be formed on the transparent conductive layer 33 by the same process.

Figure 9:
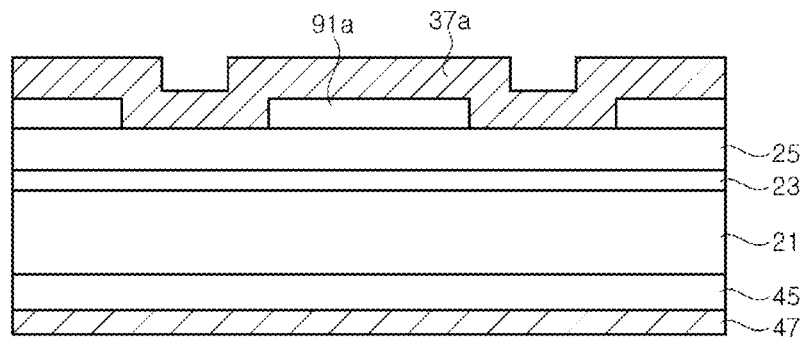
FIG. 9 is a sectional view of an LED chip according to yet another exemplary embodiment of the invention.

FIG. 9 is a sectional view of an LED chip according to yet another exemplary embodiment of the invention. FIG. 9 corresponds to the sectional view taken along line C-C of FIG. 1.

Referring to FIG. 9, the LED chip of this embodiment is generally similar to the LED chips described above. In this embodiment, however, grooves are linearly formed on a semiconductor stack 30 instead of the plurality of through-holes 30a. The grooves expose a first conductive type semiconductor layer 25 and first electrode extensions 37a are connected to the first conductive type semiconductor layer 25 in the grooves. In this embodiment, the dot pattern formed of an insulation material is located between the first conductive type semiconductor layer 25 and first electrode extensions 37a and partially separates the first electrode extensions 37a from the first conductive type semiconductor layer 25.

Since the dot pattern allows the first electrode extensions 37a to be connected to the first conductive type semiconductor layer 25 in a plurality of dot regions separated from each other instead of being continuously connected thereto, it is possible to relieve current crowding around the first electrode extensions 37a.

Figure 10:
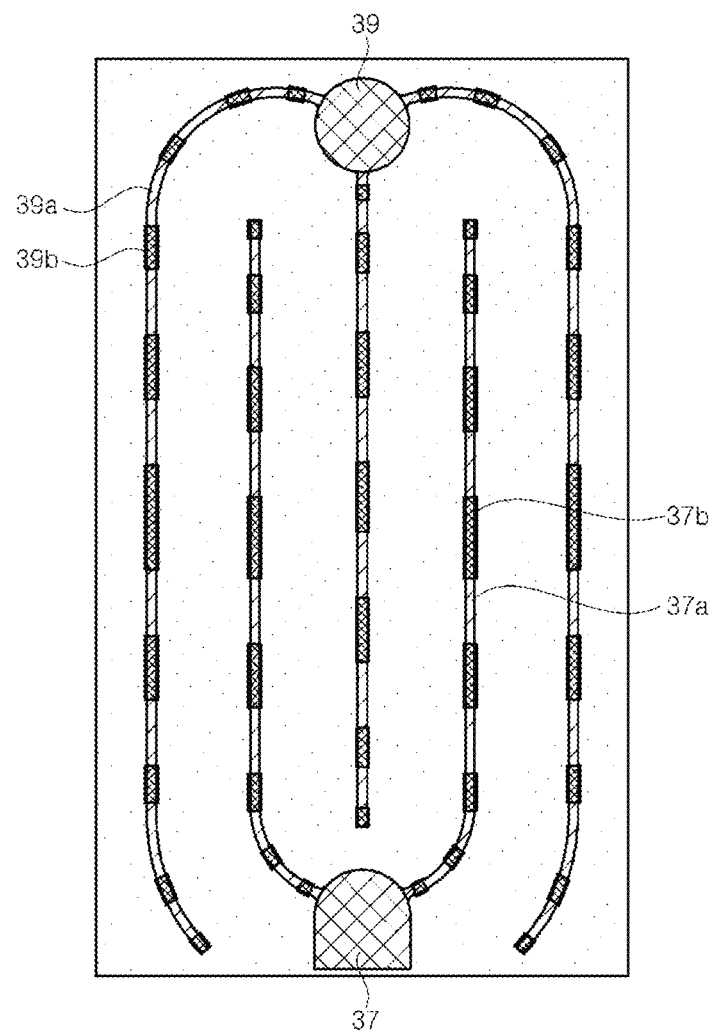
FIG. 10 is a plan view of an LED chip according to yet another exemplary embodiment of the invention.

FIG. 10 is a plan view of an LED chip according to yet another exemplary embodiment of the invention Referring to FIG. 10, first electrode extensions 37a are connected to a first conductive type semiconductor layer 25 in a plurality of dot regions 37b. The plurality of dot regions 37b may correspond, for example, to the regions where the first electrode extensions 37a are connected to the first conductive type semiconductor layer 25 in the plurality of through-holes 30a in the LED chip described with reference to FIGS. 1 and 2, or to the regions where the first electrode extensions 37a are connected to the first conductive type semiconductor layer 25 in the grooves in the LED chip described with reference to FIG. 9.

Further, second electrode extensions 39a are connected to the second conductive type semiconductor layer 29 through a transparent conductive layer 33 in a plurality of dot regions 39b. The plurality of dot regions 39b may correspond, for example, to the regions where the second electrode extensions 39a are connected to the transparent conductive layer 33 between the dots of the second functional layer 71b in the LED chip described with reference to FIG. 7, or to the regions where the second electrode extensions 39a are connected to the transparent conductive layer 33 between the dots of the second functional layer 81b in the grooves in the LED chip described with reference to FIG. 8.

The dot regions 37b, 39b may have different sizes and current spreading of the LED chip may be improved by adjusting the sizes of the dot regions. The sizes of the dot regions 37b may be controlled by adjusting the sizes of the through-holes 30a or the size of the dot pattern 91a (see FIG. 9a), and the sizes of the dot regions 39b may be controlled by adjusting the size of the second functional layer 71b or 81b.

For example, the dot regions 37b in the first electrode extensions 37a may be divided into first dot regions closer to the first electrode pad 37 than the second electrode pad 39 and second dot regions closer to the second electrode pad than the first electrode pad. The sizes of the first dot regions may increase as the distance between the first dot regions and the first electrode pad 37 increases and the sizes of the second dot regions may decrease as the distance between the second dot regions and the first electrode pad 37 increases.

Further, the dot regions 39b in the second electrode extensions 39a may be divided into third dot regions closer to the second electrode pad 39 than the first electrode pad 37 and fourth dot regions closer to the first electrode pad than the second electrode pad. The sizes of the third dot regions may increase as the distance between the third dot regions and the second electrode pad 39 increases and the sizes of the fourth dot regions may decrease as the distance between the fourth dot regions and the second electrode pad 39 increases.

Generally, since electric current tends to crowd around the first electrode pad 37 or the second electrode pad 39, the LED chip is configured to have relatively small dot regions formed in regions near these electrode pads 37, 39 and relatively large dot region formed in regions distant from these electrode pads, thereby enhancing current spreading.

In addition, the sizes of the dot regions may increase as the distance between the dot regions and a line crossing the first electrode pad 37 and the second electrode pad 39 increases, thereby preventing current crowding at a central region of the LED chip.

Figure 11:
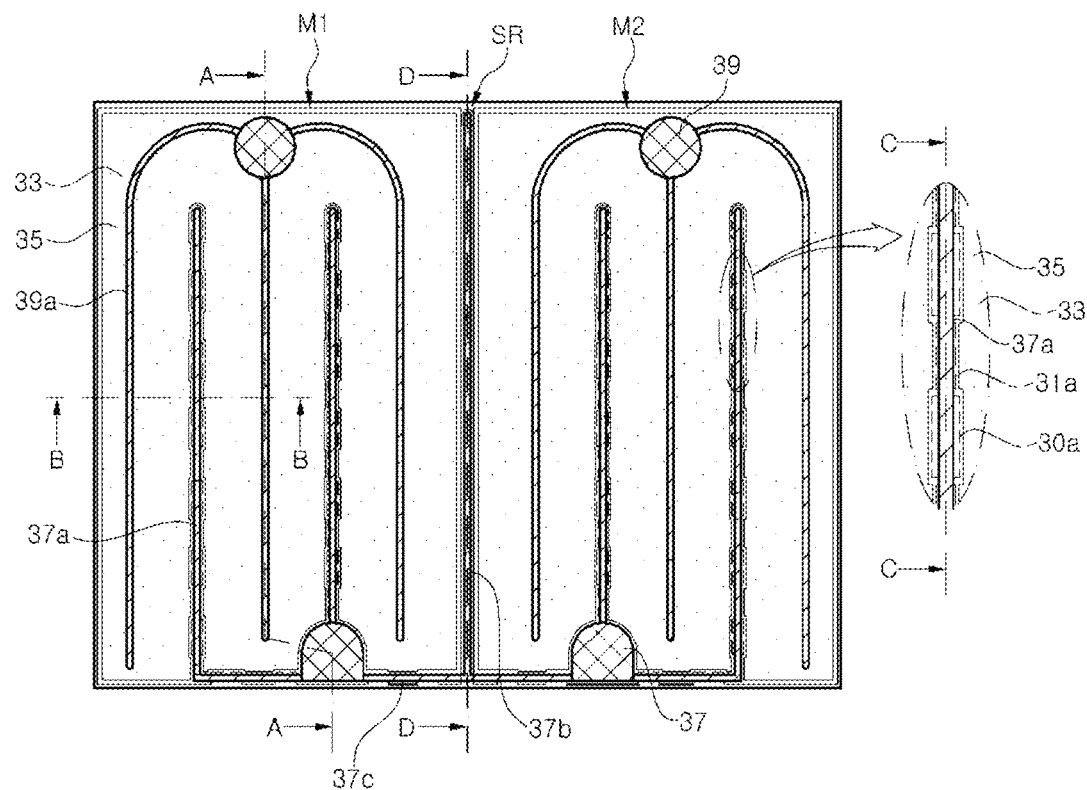
FIG. 11 is a schematic plan view of an LED chip according to yet another exemplary embodiment of the invention.

FIG. 11 is a schematic plan view of an LED chip according to yet another exemplary embodiment of the invention, and FIGS. 12a, 12b, 12c and 12d are sectional views taken along lines A-A, B-B, C-C and D-D of FIG. 11, respectively.

Referring to FIG. 11 and FIGS. 12a, 12b, 12c and 12d, the LED chip may include a semiconductor stack 30, a plurality of mesa structures M1, M2, a separation region SR, a first electrode pad 37, a second electrode pad 39, first electrode extensions 37a, 37b, 37c, second electrode extensions 39a, and a protective insulation layer 35. The LED chip may further include a substrate 21, a buffer layer 23, a first functional layer 31a, a second functional layer 31b, a transparent conductive layer 33, a lower reflector 45, and a metal layer 47. Meanwhile, the semiconductor stack 30 includes a first conductive type semiconductor layer 25, an active layer 27, and a second conductive type semiconductor layer 29.

The substrate 21, first conductive type semiconductor layer 25, active layer 25 and second conductive type semiconductor layer 29 of the LED chip according to this embodiment are similar to those of the LED chip described with reference to FIGS. 1, 2a, 2b and 2c, and detailed descriptions thereof will thus be omitted herein.

The semiconductor stack 30 includes the plurality of mesa structures M1, M2 separated from each other by the separation region SR. Each of the mesa structures M1, M2 includes the second conductive type semiconductor layer 29 and the active layer 27 interposed between the first conductive type semiconductor layer 25 and the second conductive type semiconductor layer 29. Namely, the second conductive type semiconductor layer 29 and the active layer 27 are separated by the separation region SR, thereby forming the plurality of mesa structures M1, M2. An upper surface of the first conductive type semiconductor layer 25 is exposed by the separation region SR.

The plurality of mesa structures M1, M2 may have the same shapes. For example, as shown in FIG. 11, two mesa structures M1, M2 may have symmetrical structures with respect to the separation region SR. In this embodiment, the LED chip is illustrated as including the two mesa structures M1, M2, but the invention is not limited thereto. It should be understood that the LED chip according to the invention may have two or more mesa structures.

Each of the mesa structures M1, M2 has a plurality of through-holes 30a extending through second conductive type semiconductor layer 29 and the active layer 27 to expose the first conductive type semiconductor layer 25. The plurality of through-holes 30a is linearly arranged along first electrode extensions 37a, as shown in FIG. 11.

The transparent conductive layer 33 may be formed on the second conductive type semiconductor layer 29. The transparent conductive layer 33 may be formed of indium tin oxide (ITO) or Ni/Au and forms an ohmic contact with the second conductive type semiconductor layer 29.

Figure 12A:
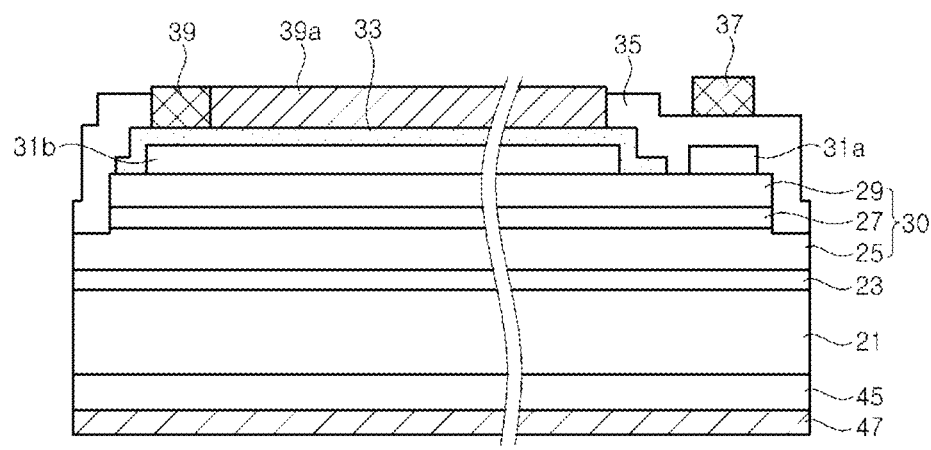
FIGS. 12a, 12b, 12c and 12d are sectional views taken along lines A-A, B-B, C-C and D-D of FIG. 11, respectively.
Figure 12B:
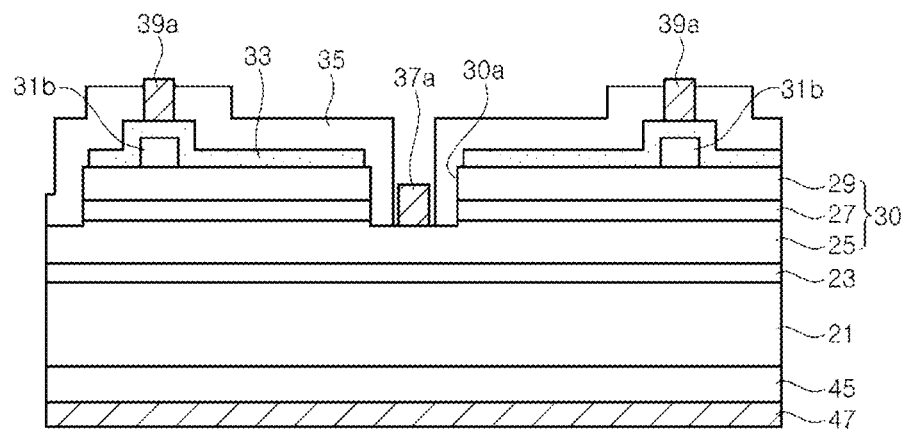
Figure 12C:
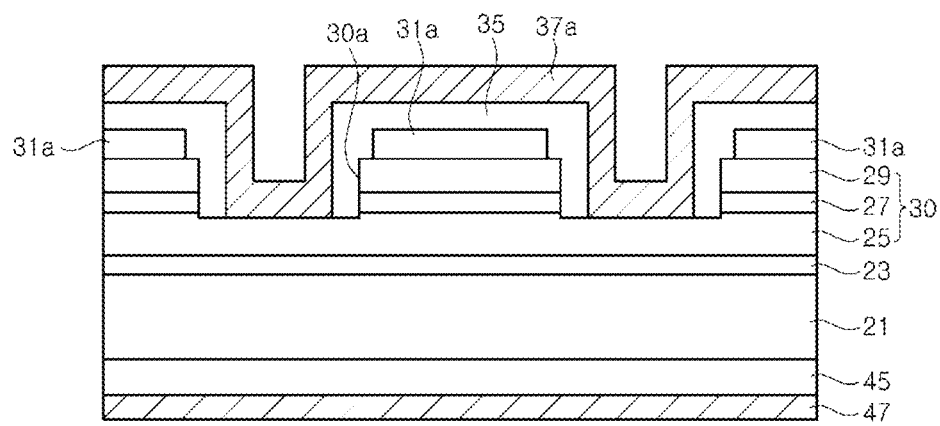

As clearly shown in FIG. 12a, the first electrode pad 37 is located on the second conductive type semiconductor layer 29 of the semiconductor stack 30. The first electrode pad 37 may include a plurality of electrode pads 37 located on the mesa structures M1, M2, respectively. These electrode pads may be connected to each other by, for example, the electrode extension 37c. The first electrode extensions 37a extend from the first electrode pad 37. The first electrode pad 37 is insulated from the semiconductor stack 30 and electrically connected to the first conductive type semiconductor layer 25 through the first electrode extensions 37a. The first electrode extensions 37a are connected to the first conductive type semiconductor layer 25 exposed through the plurality of through-holes 30a.

Meanwhile, the first electrode extension 37b may be connected to the first conductive type semiconductor layer 25 exposed on the separation region SR. The first electrode extension 37b is electrically connected to the first electrode pad 37.

Figure 12D:
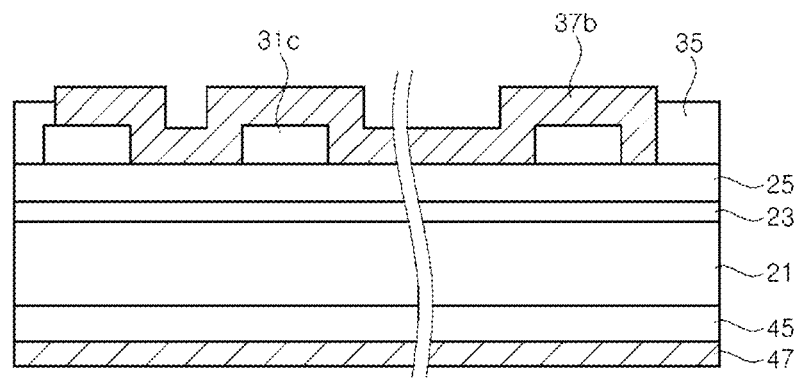

As clearly shown in FIG. 12d, the first conductive type semiconductor layer 25 is exposed through the separation region SR and the first electrode extension 37b is connected to the first conductive type semiconductor layer 25 in the separation region SR. Meanwhile, a dot pattern 31c formed of an insulation material is located between the first conductive type semiconductor layer 25 and the first electrode extension 37b such that the first electrode extension 37b can be partially separated from the first conductive type semiconductor layer 25. The dot pattern 31c allows the first electrode extension 37b to be connected to the first conductive type semiconductor layer 25 in a plurality of dot region separated from each other instead of being continuously connected thereto, thereby relieving current crowding around the first electrode extension 37b.

The second electrode pad 39 may be located on the transparent conductive layer 33. The second electrode pad 39 may include a plurality of electrode pads 39 located on the mesa structures M1, M2, respectively. Further, the second electrode extensions 39a may extend from the second electrode pad 39. The second electrode pad 39 and the second electrode extensions 39a may be connected to the transparent conductive layer 33.

Meanwhile, a protective insulation layer 35 is located on the semiconductor stack 30 to cover the semiconductor stack 30. The protective insulation layer 35 may cover the transparent conductive layer 33. In addition, the protective insulation layer 35 is interposed between the first electrode pad 37 and the second conductive type semiconductor layer 29 to separate the first electrode pad 37 from the second conductive type semiconductor layer 29, and between the first electrode extensions 37a and the second conductive type semiconductor layer 29 to separate the first electrode extensions 37a from the second conductive type semiconductor layer 29. Further, the protective insulation layer 35 covers side walls of the plurality of through-holes 30a to insulate the first electrode extensions 37a from the sidewalls. The protective insulation layer 35 may also separate the first electrode extension 37b from the second conductive type semiconductor layer 29.

The first functional layer 31a may be interposed in a pattern of dots between the protective insulation layer 35 and the second conductive type semiconductor layer 29 under the first electrode pad 37 and the first electrode extensions 37a. Further, the second functional layer 31b may be located between the transparent conductive layer 33 and the second conductive type semiconductor layer 29. The first functional layer 31a and the second functional layer 31b are similar to the first functional layer 31a and the second functional layer 31b described with reference to FIGS. 1, 2a, 2b and 2c, and detailed descriptions thereof will thus be omitted herein. The second functional layer 31b may be formed of the same material as that of the first functional layer 31a and the dot pattern 31c may also be formed of the same material as that of the functional layers 31a, 31b.

In this embodiment, the lower reflector 45 is located under the substrate 21 and the metal layer 47 may be located under the lower reflector 45. The lower reflector and the metal layer 47 are similar to the lower reflector 45 and the metal layer 47 described with reference to FIG. 1, FIGS. 2a, 2b and 2c, and detailed descriptions thereof will be omitted herein.

According to this embodiment, the plurality of mesa structures M1, M2 are separated from each other and located on the first conductive type semiconductor layer 25. Therefore, when the LED chip is operated at high electric current, the electric current spreads to and flows through the respective mesa structures M1, M2. Thus, it is possible to prevent a reduction in external quantum efficiency due to current crowding at a certain position of the semiconductor stack 30. In particular, if a certain mesa structure has a defect, the LED chip may prevent flow of high electric current through the defect, thereby preventing a reduction in external quantum efficiency of a large LED chip.

Next, a method of fabricating the LED chip will be described.

First, epitaxial layers 25, 27, 29 are grown on a substrate 21. A buffer layer 23 may further be formed before forming the epitaxial layers. Then, a second conductive type semiconductor layer 29 and an active layer 27 are patterned to form a semiconductor stack 30 having a plurality of mesa structures M1, M2. At this time, a plurality of through-holes 30a is also formed therein and a separation region SR is formed to divide the mesa structures M1, M2 from each other.

Then, a first functional layer 31a and a second functional layer 31b are formed on the second conductive type semiconductor layer 29. Further, a dot pattern 31c may be formed together therewith. The first functional layer 31a may be formed in a dot pattern on a region to be formed with a first electrode pad 37 and on regions of the second conductive type semiconductor layer between the plurality of through-holes 30a. The second functional layer 31b is formed along regions where a second electrode pad 39 and second electrode extensions 39a will be formed. The dot pattern 31c is formed on regions of the first conductive type semiconductor layer 25 exposed by the separation region SR. Both the first functional layer 31a and the second functional layer 31b may be formed of an insulation material or a reflective material. Further, the first and second functional layers 31a, 31b may be formed as distributed Bragg reflectors. The first and second functional layers 31a, 31b may be formed before the formation of the semiconductor stack 30 of the mesa structures.

Then, a transparent conductive layer 33 is formed on the second conductive type semiconductor layer 29. The transparent conductive layer 33 is connected to the second conductive type semiconductor layer 29 and covers the second functional layer 31b. At this time, the first functional layer 31a is exposed, instead of being covered with the transparent conductive layer 33.

Then, a protective insulation layer 35 is formed to cover the transparent conductive layer 33, the first functional layer 31a and the plurality of through-holes 30a. Meanwhile, the protective insulation layer 35 in the plurality of through-holes 30a is etched to expose the first conductive type semiconductor layer 25. In addition, the protective insulation layer 35 above the second functional layer 31b is etched to expose the transparent conductive layer 33. Further, the protective insulation layer 35 may cover sidewalls of the mesa structures M1, M2 located at opposite sides of the separation region SR.

Next, the first electrode pad 37, the second electrode pad 39, first electrode extensions 37a, 37b, 37c, and second electrode extensions 39a are formed. Meanwhile, the first electrode extensions 37a covers the plurality of through-holes 30a linearly arranged and are connected to the first conductive type semiconductor layer 25. Meanwhile, the first electrode extension 37b is formed in the separation region SR and covers the dot pattern 31c. The first electrode extensions 37a, 37b may be connected to the first electrode pad 37 through the first electrode extensions 37c, and the plurality of electrode pads are respectively located on the mesa structures M1, M2 to be connected to each other through the first electrode extensions 37c. The first electrode extensions 37c may be arranged along edges of the mesa structures M1, M2. In this case, the first electrode extensions 37c may also be partially connected to the first conductive type semiconductor layer 25. The first electrode extensions 37c may be connected to the first conductive type semiconductor layer at portions on the edges of the mesa structures M1, M2 having the second conductive type semiconductor layer 29 and the active layer 27 removed therefrom, instead of being connected thereto in the through-holes 30a. In other words, portions of the through-holes 30a having the first electrode extensions 37c connected to the first conductive type semiconductor layer 25 may be exposed to the outside of the mesa structures M1, M2.

Further, the second electrode pad 39 and the second electrode extensions 39a are formed on the transparent conductive layer 33 above the second functional layer 31b.

Then, a lower reflector 45 and a metal layer 47 are formed under the substrate 21, and then the substrate 21 is divided into individual LED chips, thereby finishing preparation of the LED chips.

In this embodiment, the dot pattern 31c is formed by the same process as that used to form the first functional layer 31a and the second functional layer 31b. However, the dot pattern 31c may be omitted from the LED chip. In this case, after a protective insulation layer 35 is formed to cover the separation region SR, the protective insulation layer 35 in the separation region SR is partially etched to form a plurality of openings through which the first conductive type semiconductor layer 25 is exposed, thereby forming an insulation pattern that partially separates the first electrode extension 37b from the first conductive type semiconductor layer 25.

Figure 13:
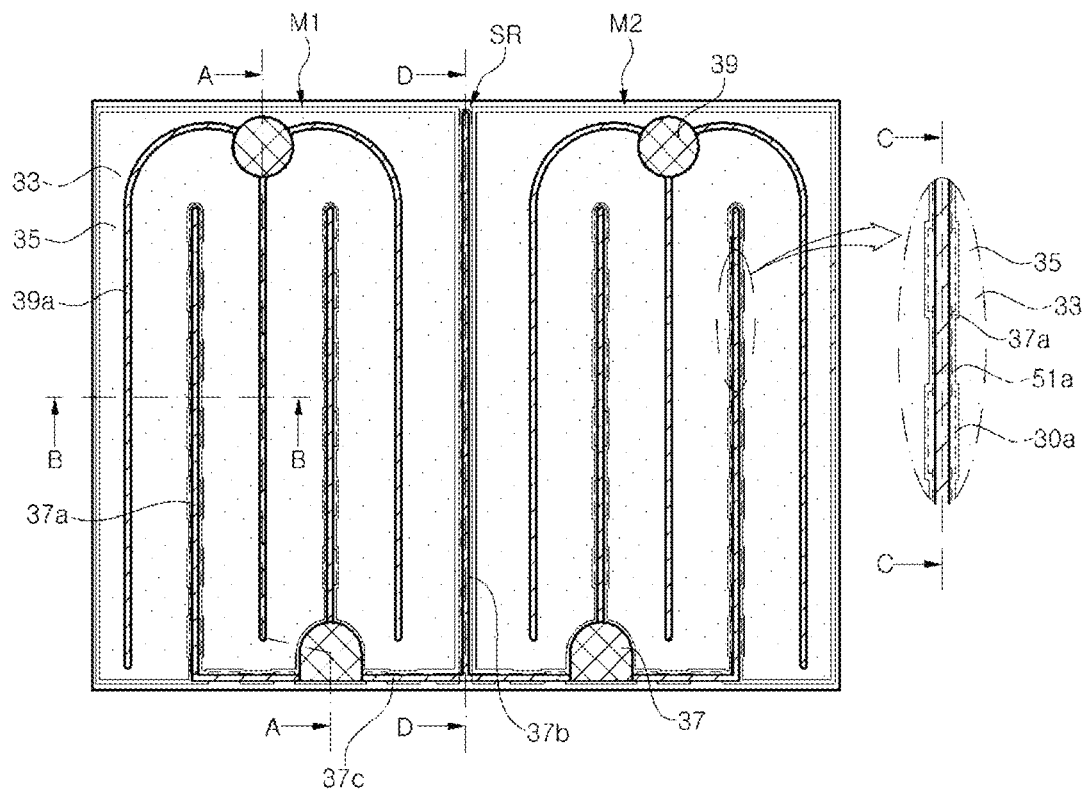
FIG. 13 is a schematic plan view of an LED chip according to yet another exemplary embodiment of the invention.

FIG. 13 is a schematic plan view of an LED chip according to yet another exemplary embodiment of the invention, and FIGS. 14a, 14b, 14c and 14d are sectional views taken along lines A-A, B-B, C-C and D-D of FIG. 13, respectively.

Referring to FIGS. 13, 14a, 14b, 14c and 14d, the LED chip according to this embodiment is generally similar to the LED chip of the above exemplary embodiment described with reference to FIGS. 11, 12a, 12b, 12c and 12d, and detailed descriptions of identical components will thus be omitted herein.

Figure 14A:
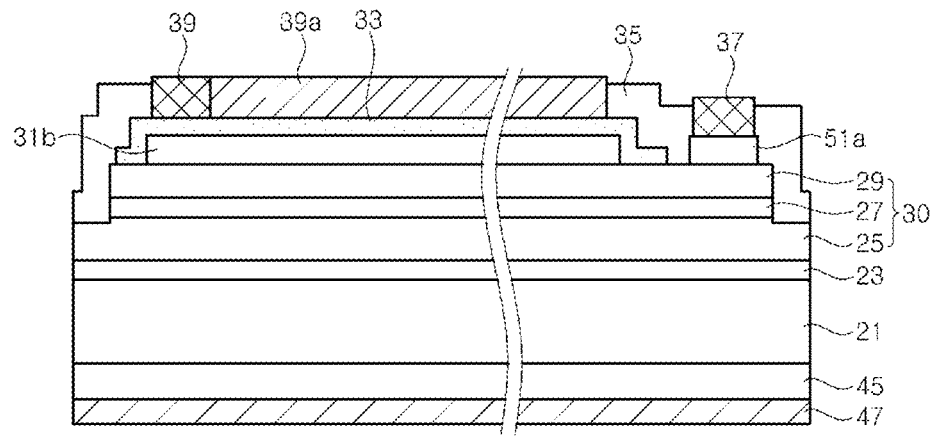
FIGS. 14a, 14b, 14c and 14d are sectional views taken along lines A-A, B-B, C-C and D-D of FIG. 13, respectively.
Figure 14B:
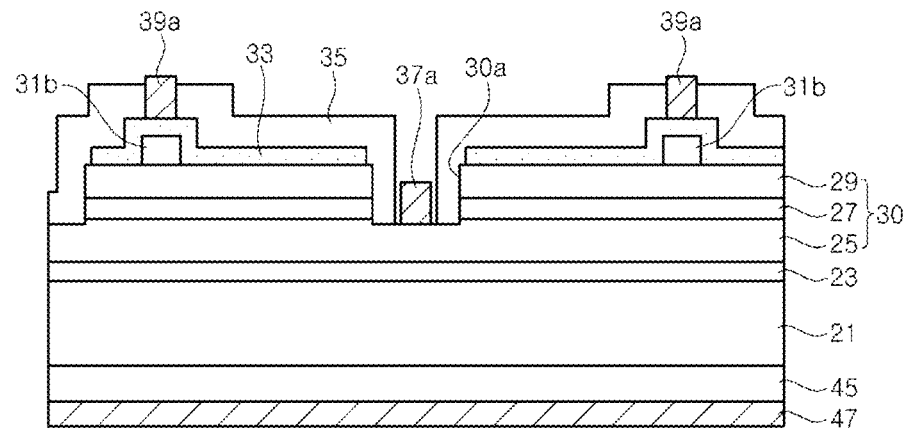
Figure 14C:
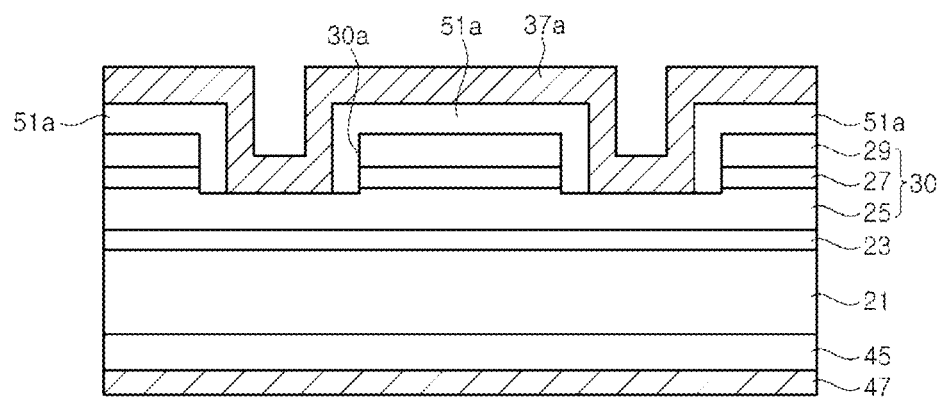
Figure 14D:
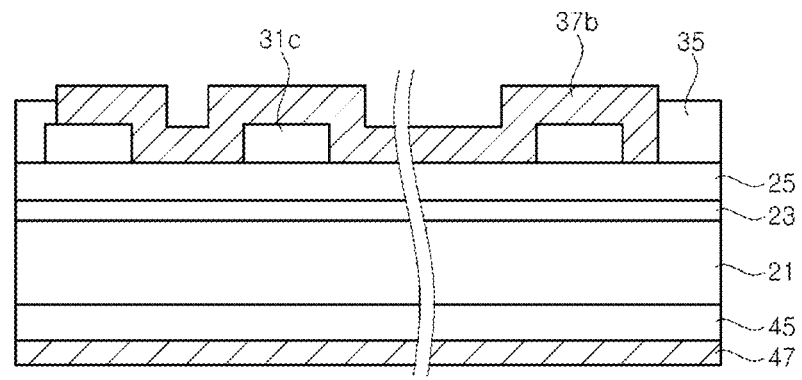

First, as shown in FIG. 14a, a first electrode pad 37 is directly located on a first functional layer 51a. Namely, the protective insulation layer 35 is removed from between the first electrode pad 37 and the first functional layer 51a. Further, the protective insulation layer 35 is also removed from between the first electrode extensions 37a and the semiconductor stack 30. Here, the first functional layer 51a is formed of an insulation material and may constitute a distributed Bragg reflector. A second functional layer 31b may also be formed of the same material as that of the first functional layer 51a by the same process.

Meanwhile, the first electrode extensions 37a in a plurality of through-holes 30a are separated from sidewalls in the through-holes 30a by the first functional layer 51a. Specifically, the first functional layer 51a located on the second conductive type semiconductor layer 29 in regions between the plurality of through-holes 30a extends into the plurality of through-holes 30a and covers the sidewalls of the through-holes 30a. Meanwhile, some of the sidewalls, that is, sidewalls located at opposite sides of the first electrode extensions 37a in the plurality of through-holes 30a, may be covered with the protective insulation layer 35.

In the previous exemplary embodiment, openings formed on the protective insulation layer 35 include regions exposing the transparent conductive layer 33 and regions exposing the first conductive type semiconductor layer 25 in the plurality of through-holes 30a and the separation region SR. Among these regions, the regions exposing the transparent conductive layer 33 correspond to regions at which the second electrode pad 39 and the second electrode extensions 39a are formed, but the regions exposing the first conductive type semiconductor layer do not correspond to the first electrode pad 37 and the first electrode extensions 37a, 37b. Accordingly, when the first and second electrode pads 37, 39 and the first and second electrode extensions 37a, 37b, 37c, 39a are simultaneously formed by lift-off, the pattern of openings is first formed on the protective insulation layer 35 using a photomask, and the first and second electrode pads 37, 39 and the first and second electrode extensions 37a, 37b, 37c, 39a are formed using another photomask.

According to the present embodiment, however, since the shapes of the first and second electrode pads 37, 39 and the shapes of the first and second electrode extensions 37a, 37b, 37c, 39a correspond to the pattern of openings formed on the protective insulation layer 35, the first and second electrode pads 37, 39 and the first and second electrode extensions 37a, 37b, 37c, 39a may be formed using the same photomask as that for patterning the protective insulation layer 35. In addition, after forming the pattern of openings on the protective insulation layer 35 using a photoresist, the photoresist may be continuously used to form the first and second electrode pads 37, 39 and the first and second electrode extensions 37a, 37b, 37c, 39a. Accordingly, it is possible to reduce the number of photomasks for fabrication of LED chips, so that the number of photolithography and developing processes for forming the photoresist pattern can be reduced.

Figure 15A:
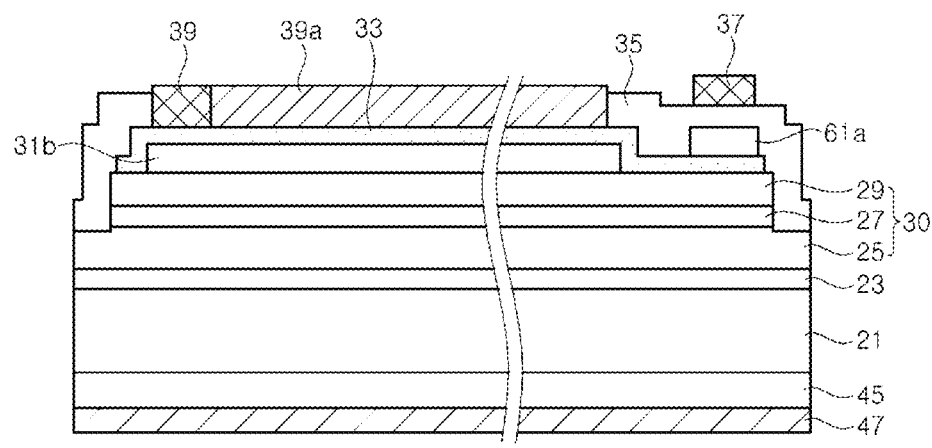
FIGS. 15a, 15b and 15c are sectional views of an LED chip according to yet another exemplary embodiment of the invention.
Figure 15B:
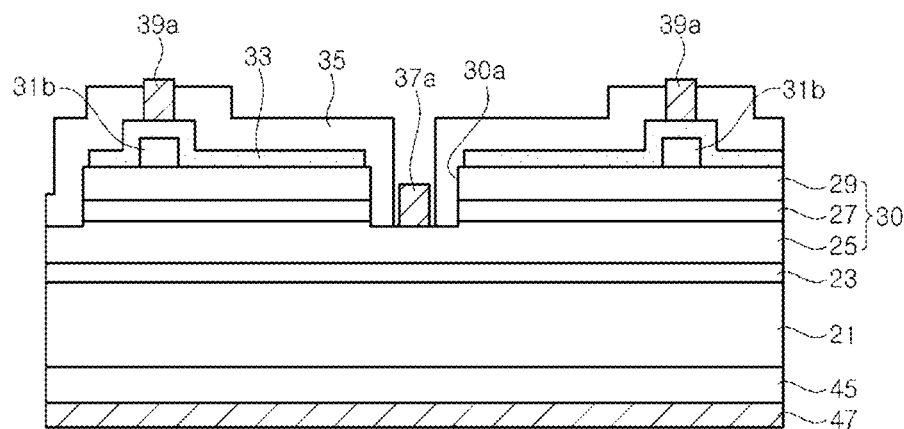
Figure 15C:
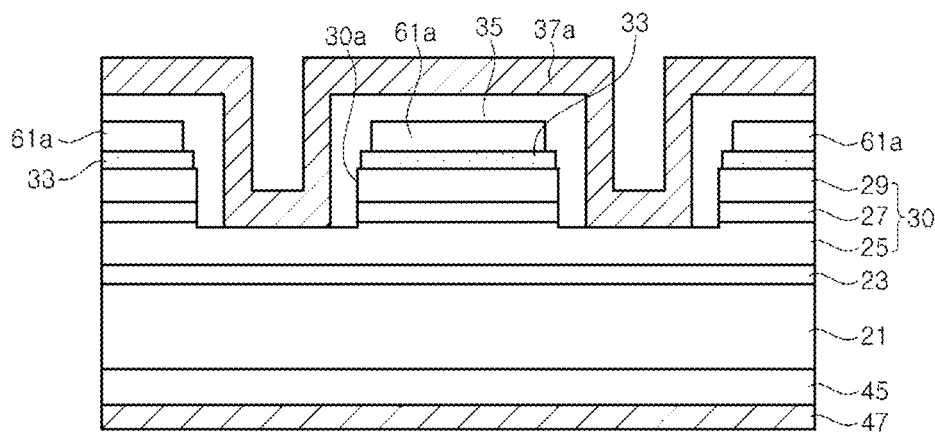

FIGS. 15a, 15b and 15c are sectional views of an LED chip according to yet another exemplary embodiment of the invention. The respective figures correspond to sectional views taken along lines A-A, B-B and C-C of FIG. 11. Further, in this embodiment, the sectional view taken along line D-D of FIG. 11 is the same as the corresponding sectional view of the present embodiment and is thus omitted herein.

Referring to FIGS. 15a, 15b and 15c, the LED chip according to this embodiment is generally similar to the LED chip described with reference to FIGS. 11 and 12. In this embodiment, however, a transparent conductive layer 33 extends to a region between a first electrode pad 37 and a second conductive type semiconductor layer 29 and to regions between first electrode extensions 37a and the second conductive type semiconductor layer 29. The transparent conductive layer 33 may also extend to regions between a first electrode extension 37c and the second conductive type semiconductor layer 29.

Specifically, in the exemplary embodiment of FIG. 11, the transparent conductive layer 33 is not formed on regions of the second conductive type semiconductor layer 29 under the first electrode pad 37 and the first electrode extensions 37a, 37c, whereas the transparent conductive layer 33 is also formed on these regions in this embodiment. Since the transparent conductive layer 33 is connected to the regions of the second conductive type semiconductor layer 29 under the first electrode pad 37 and the first electrode extensions 37a, 37c, electric current can be supplied to the semiconductor stack 30 in these regions.

The first electrode pad 37 and the first electrode extensions 37a, 37c are insulated from the transparent conductive layer 33 by the protective insulation layer 35, and a first functional layer 61a may be located between the protective insulation layer 35 and the transparent conductive layer 33.

In this embodiment, the first functional layer 61a and a second functional layer 31b are formed by separate processes. Specifically, after the transparent conductive layer 33 is formed to cover the second functional layer 31b, the first functional layer 61a is formed again on the transparent conductive layer 33.

Figure 16A:
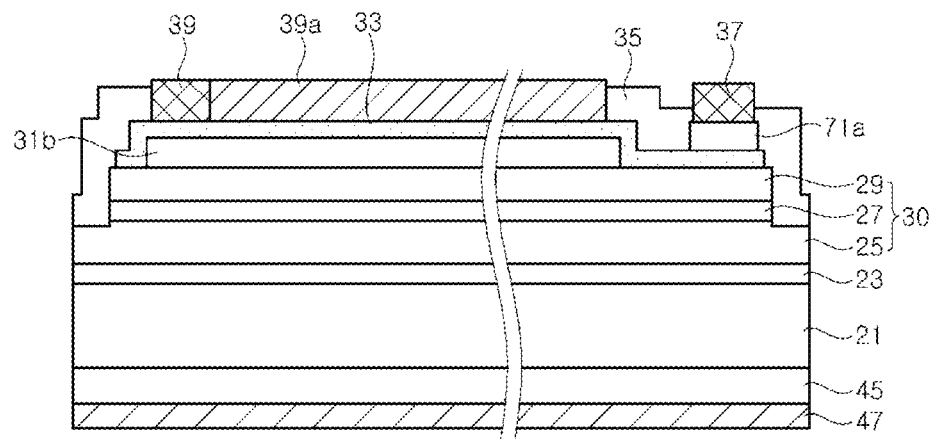
FIGS. 16a, 16b and 16c are sectional views of an LED chip according to yet another exemplary embodiment of the invention, respectively.
Figure 16B:
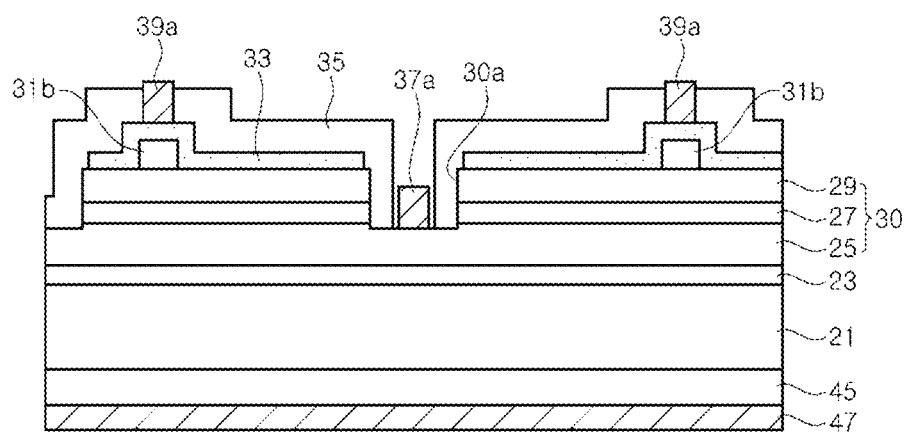
Figure 16C:
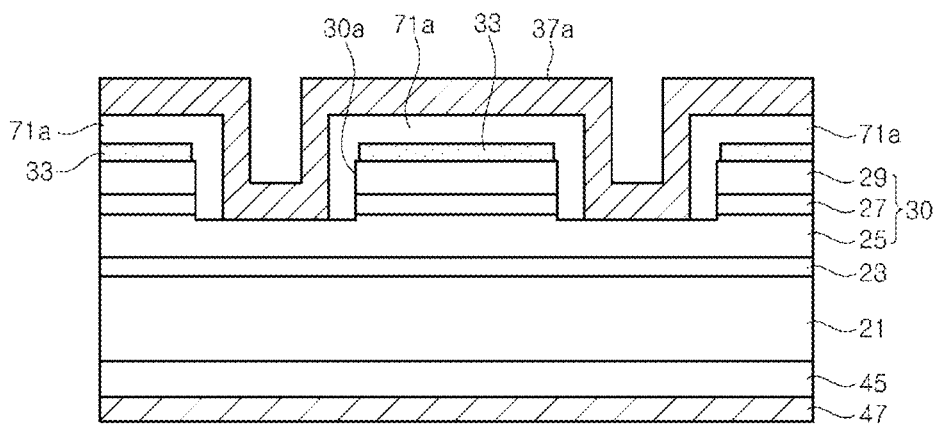

FIGS. 16a, 16b and 16c are sectional views of an LED chip according to yet another exemplary embodiment of the invention. The respective figures correspond to sectional views taken along lines A-A, B-B and C-C of FIG. 13. Further, in this embodiment, the sectional view taken along line D-D of FIG. 13 is the same as the corresponding sectional view of the present embodiment and is thus omitted herein.

Referring to FIGS. 16a, 16b and 16c, the LED chip of this embodiment is generally similar to the LED chip described with reference to FIGS. 13 and 14. In this embodiment, however, a transparent conductive layer 33 extends to a region between a first electrode pad 37 and a second conductive type semiconductor layer 29 and to regions between first electrode extensions 37a and the second conductive type semiconductor layer 29. The transparent conductive layer 33 may also extend to regions between a first electrode extension 37c and the second conductive type semiconductor layer 29.

Specifically, in the exemplary embodiment of FIG. 13, the transparent conductive layer 33 is not formed on regions of the second conductive type semiconductor layer 29 under the first electrode pad 37 and the first electrode extensions 37a, 37c, whereas the transparent conductive layer 33 is located on these regions in the present embodiment. Since the transparent conductive layer 33 is connected to the regions of the second conductive type semiconductor layer 29 under the first electrode pad 37 and the first electrode extensions 37a, 37c, electric current can be supplied to the semiconductor stack 30 in these regions.

The first electrode pad 37 and the first electrode extensions 37a, 37c are insulated from the transparent conductive layer 33 by a first functional layer 71a.

In this embodiment, the first functional layer 71a and a second functional layer 31b are formed by separate processes. Specifically, after the transparent conductive layer 33 is formed to cover the second functional layer 31b, the first functional layer 71a is formed again on the transparent conductive layer 33.

Figure 17:
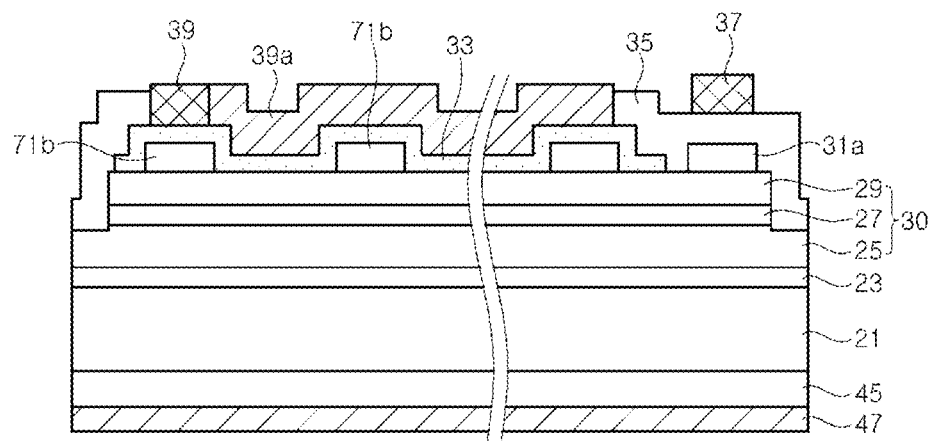
FIG. 17 is a sectional view of an LED chip according to yet another exemplary embodiment of the invention.

FIG. 17 is a sectional view of an LED chip according to yet another exemplary embodiment of the invention Referring to FIG. 17, the LED chip according to this embodiment is generally similar to the LED chip described with reference to FIGS. 11 and 12. In this embodiment, however, a second functional layer 71b is arranged in a pattern of dots along a second electrode pad 39 and second electrode extensions 39a.

Specifically, the second functional layer 71b is arranged in the pattern of dots instead of being linearly arranged. In this embodiment, the transparent conductive layer 33 covers the second functional layer 71b and is connected to the second conductive type semiconductor layer 29 in regions between the dots.

Arrangement of the second functional layer 71b in the dot pattern may be applied not only to the exemplary embodiment shown in FIGS. 11 and 12, but also to the exemplary embodiments shown in FIGS. 13 to 16.

Figure 18:
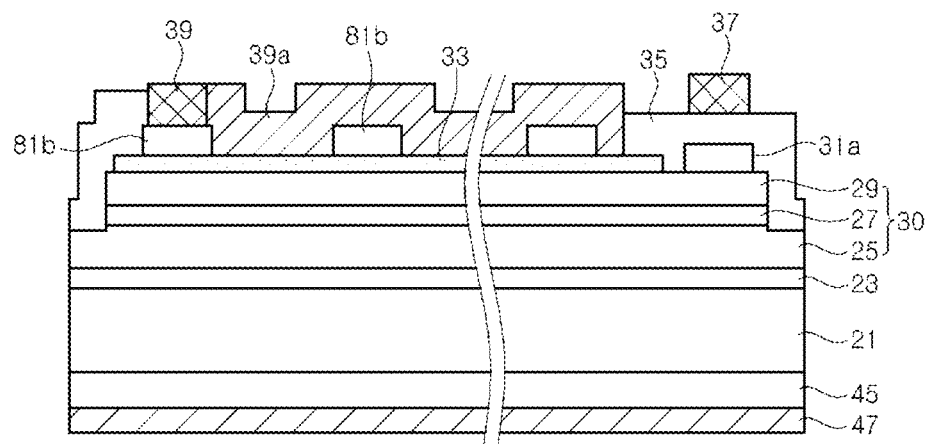
FIG. 18 is a sectional view of an LED chip according to yet another exemplary embodiment of the invention.

FIG. 18 is a sectional view of an LED chip according to yet another exemplary embodiment of the invention.

Referring to FIG. 18, the LED chip according to this embodiment is generally similar to the LED chip described with reference to FIGS. 11 and 12. In this embodiment, however, a second functional layer 81b is arranged in a pattern of dots along a second electrode pad 39 and second electrode extensions 39a on a transparent conductive layer 33.

Specifically, the second functional layer 81b is arranged in the pattern of dots between a transparent conductive layer 33 and a second electrode pad 30 and between the transparent conductive layer 33 and the second electrode extensions 39a. The second electrode extensions 39a are connected to the transparent conductive layer 33 in regions between the dots.

The second functional layer 81b according to this embodiment may be applied not only to the exemplary embodiment shown in FIGS. 11 and 12, but also to the exemplary embodiments shown in FIGS. 13 to 16. Furthermore, when the second functional layer 81b is applied to the exemplary embodiments of FIGS. 15 and 16, the first functional layers 61a, 71a and the second functional layer 81b may be formed on the transparent conductive layer 33 by the same process.

Figure 19A:
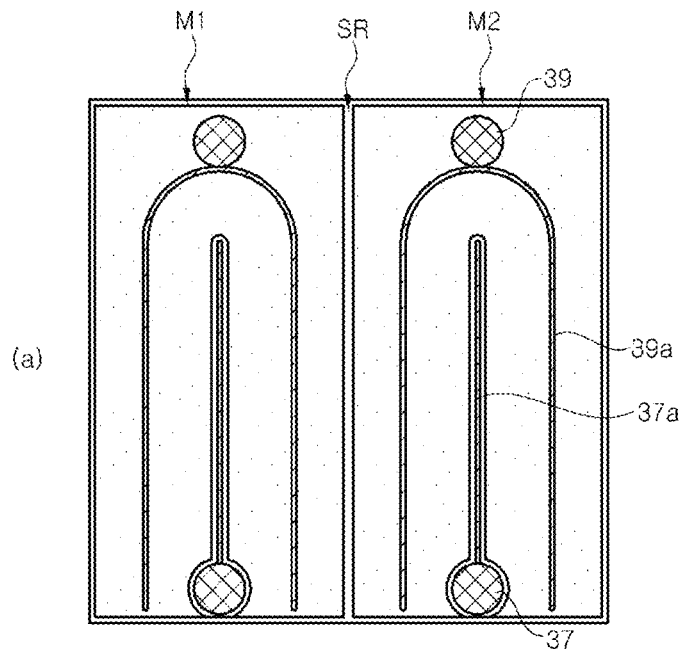
FIGS. 19(a) and 19(b) are schematic plan views of an LED chip according to yet another exemplary embodiment of the invention.
Figure 19B:
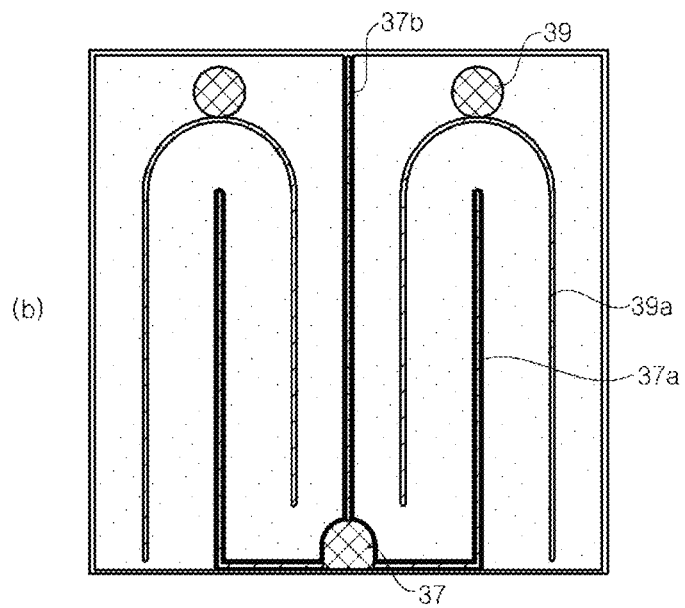

FIGS. 19(a) and 19(b) are schematic plan views of an LED chip according to yet another exemplary embodiment of the invention.

Referring to FIG. 19(a), differing from the above exemplary embodiments, the LED chip according to this embodiment includes first electrode pads 37, which are electrically separated from each other. Specifically, in the above exemplary embodiments, the first electrode pads 37 respectively located on the mesa structures M1, M2 are electrically connected to each other by the first electrode extensions 37c, whereas the first electrode pads 37 are electrically separated from each other in this embodiment.

Referring to FIG. 19(b), in the LED chip according to this embodiment, a part of the first electrode pad 37 is located in the separation region SR. The remaining portion of the first electrode pad 37 is located on the mesa structures M1 and M2. In this embodiment, two mesa structures M1 and M2 may share the first electrode pad 37, thereby reducing the number of first electrode pad 37. Further, the first electrode extension 37b in the separation region SR may be directly connected to the first electrode pad 37.

Various exemplary embodiments and modifications including two or more mesa structures M1, M2 may also be realized. Each of the mesa structures includes a first electrode pad and a second electrode pad thereon. In this case, the first electrode pads may be electrically separated from each other and the second electrode pads may also be separated from each other.

Figure 20:
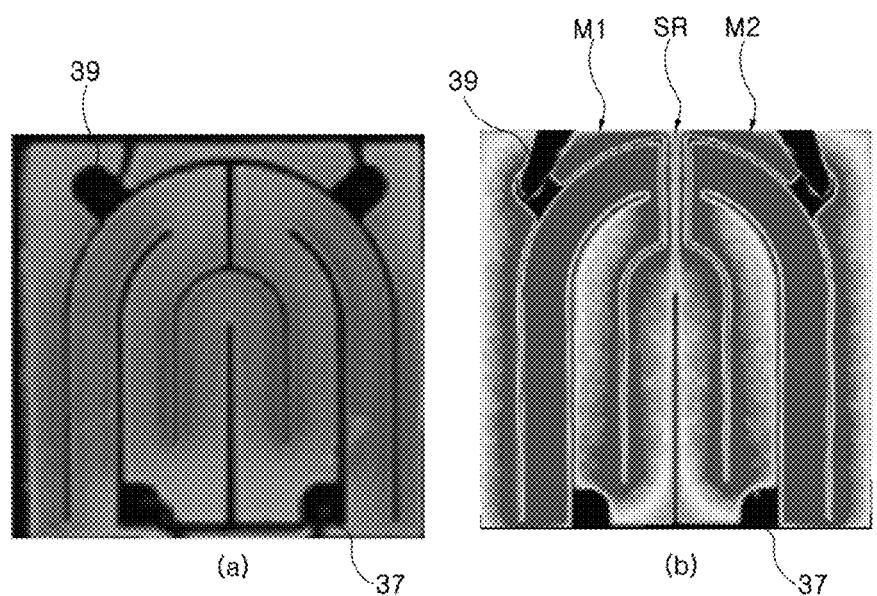
FIG. 20 is plan views illustrating light emitting patterns for explaining enhancement of light emitting characteristics when adopting a plurality of mesa structures.

FIG. 20 is plan views illustrating light emitting patterns for explaining enhancement of light emitting characteristics when adopting a plurality of mesa structures. Here, FIG. 20(a) shows a light emitting pattern of an LED chip having first electrode extensions and second electrode extensions on a single mesa structure, and FIG. 20(b) is a light emitting pattern of an LED chip having mesa structures M1, M2 which are completely separated into two regions by a separation region SR. Further, the color of a certain region approaching a red color indicates that the region emits large amounts of light, the color of a certain region approaching a blue color indicates that the region emits small amounts of light, and a black color indicates that the corresponding region does not emit light.

The LED chip of FIG. 20(a) has a single mesa structure which is not separated into two or more regions, and the LED chip of FIG. 20(b) includes mesa structures which are separated from each other by the separation region SR. Although both LED chips have a similar arrangement of electrode pads 37, 39 and electrode extensions 37a, 37b therein, it can be ascertained that the LED chip of FIG. 20(b) having two mesa structures M1, M2 completely separated from each other exhibits a more uniform light emitting pattern and emits more light than the LED chip of FIG. 20(a).

Figure 21:
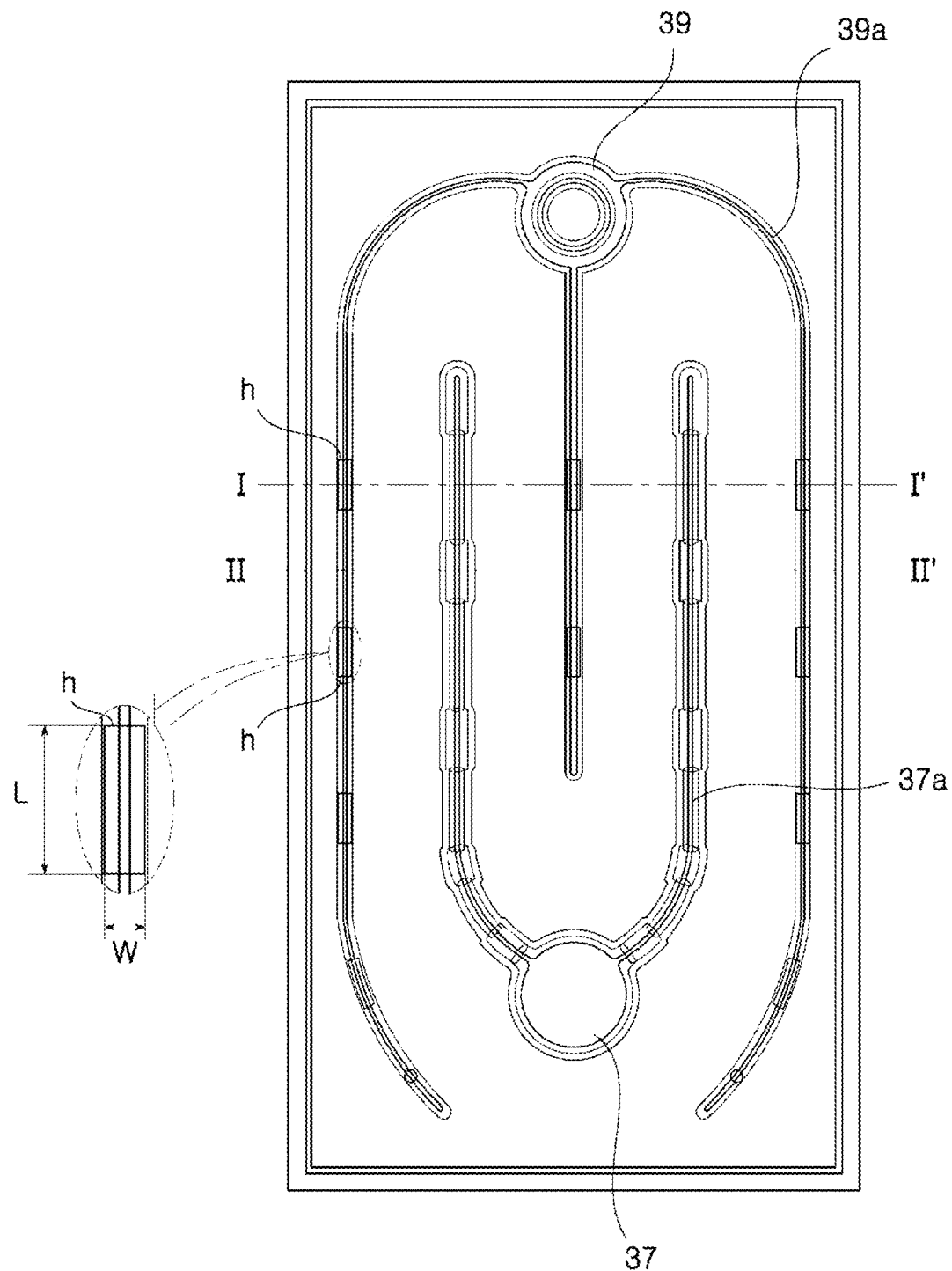
FIG. 21 is a plan view showing a light emitting diode according to yet another exemplary embodiment of the present invention.
Figure 22:
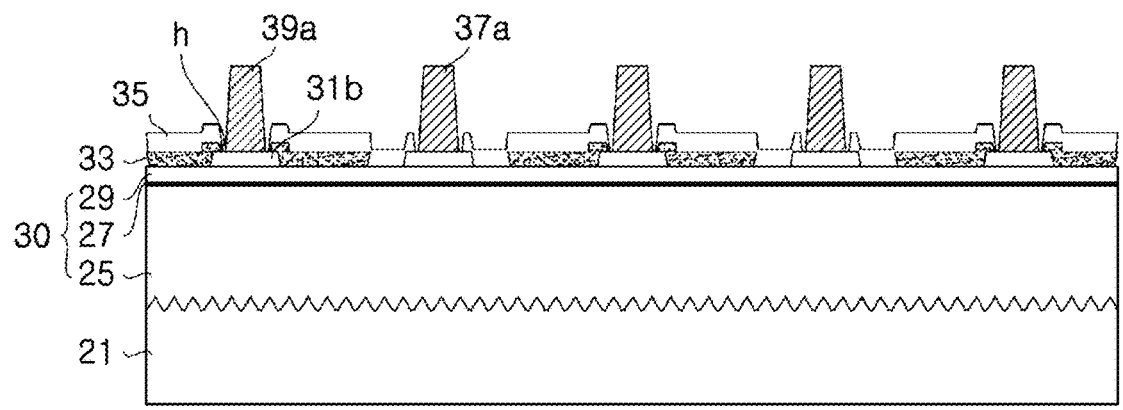
FIG. 22 is a cross-sectional view taken along line I-I' of FIG. 21.
Figure 23:
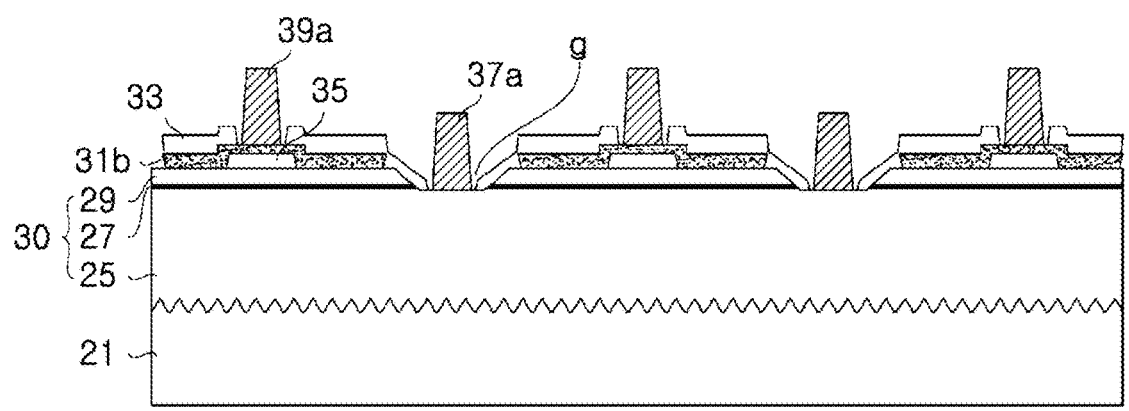
FIG. 23 is a cross-sectional view taken along line II-II' of FIG. 21.

FIG. 21 is a plan view showing a light emitting diode according to yet another exemplary embodiment of the disclosed technology, FIG. 22 is a cross-sectional view taken along line I-I' of FIG. 21, and FIG. 23 is a cross-sectional view taken along line II-II' of FIG. 21.

The light emitting diode according to yet another exemplary embodiment of the disclosed technology includes a substrate 21, a first conductive-type semiconductor layer 25, an active layer 27, a second conductive-type semiconductor layer 29, a current blocking layer 31b, a transparent conductive layer 33, a protective insulation layer 35, a first electrode pad 37, first electrode extensions 37a, a second electrode pad 39, and second electrode extensions 39a.

The substrate 21 may be or include a sapphire substrate, but is not limited thereto. The substrate 21 substantially has a quadrangular shape and has edges opposite to each other. In addition, the substrate 21 may be or include a sapphire substrate PSS having a pattern formed thereon, as shown.

The first conductive-type semiconductor layer 25 is located on the substrate 21, the second conductive-type semiconductor layer 29 is located on the first conductive-type semiconductor layer 25, and the active layer 27 is interposed between the first conductive-type semiconductor layer 25 and the second conductive-type semiconductor layer 29. The first conductive-type semiconductor layer 25, the active layer 27, and the second conductive-type semiconductor layer 29 may be formed of or include a gallium nitride (GaN) based compound semiconductor material such as (Al, In, Ga)N, or the like. In addition, elements and composition ratios of the active layer 27 are determined to emit light having a desired wavelength, for example, UV or blue light.

The first conductive-type semiconductor layer 25 may include an n-type nitride semiconductor layer, and the second conductive-type semiconductor layer 29 may include a p-type nitride semiconductor layer, or vice versa.

The first conductive-type semiconductor layer 25 and the second conductive-type semiconductor layer 29 may have a single layer structure, as shown, or a multilayer structure. In addition, the active layer 27 may have a single quantum well structure or a multi-quantum well structure. In addition, a buffer layer (not shown) such as GaN or AlN may be interposed between the substrate 21 and the first conductive-type semiconductor layer 25. The semiconductor layers may be formed by a metal organic chemical vapor deposition (MOCVD) or molecular beam epitaxy (MBE) technology.

A light emitting structure 30 has a plurality of grooves g penetrating through the second conductive-type semiconductor layer 29 and the active layer 27 to expose the first conductive-type semiconductor layer 25. The grooves provide openings positioned over the first conductive-type semiconductor layer 25 and may have various shapes. The plurality of grooves g are linearly disposed along the first electrode extensions 37a.

The transparent conductive layer 33 may be located on the second conductive-type semiconductor layer 29. The transparent conductive layer 33 may be formed of or include a transparent oxide such as an indium tin oxide (ITO) or a metal oxide such as ZnO, Al2O3, or the like, and forms an ohmic contact with the second conductive-type semiconductor layer 29. The transparent conductive layer 33 electrically contacts the second conductive-type semiconductor layer 29, and serves to spread a current over a wide area of the light emitting diode.

As shown in FIG. 22, holes h may be formed in portions of the transparent conductive layer 33 located under the second electrode extensions 39a. The holes h cause the transparent conductive layer 33 to have openings and may have various shapes. With the holes h, the second electrode extensions 39a and the transparent conductive layer 33 are electrically insulated from each other in positions in which the holes h are formed. In addition, as shown in FIG. 23, the second electrode pad 39 may be located on the transparent conductive layer 33, and the second electrode extensions 39a may extend from the second electrode pad 39. The second electrode pad 39 and the second electrode extensions 39a may be connected to the transparent conductive layer 33.

Here, in the light emitting diode according to yet another exemplary embodiment of the disclosed technology, as shown in FIG. 21, two first electrode extensions 37a extend from the first electrode pad 37, and three electrode extensions 39a extend from the second electrode pad 39.

The holes h penetrating through the transparent conductive layer 33 are formed in a state in which they are spaced apart from each other by a predetermined interval along the second electrode extensions 39a. Therefore, the second electrode extensions 39a and the transparent conductive layer 33 are not electrically connected to each other in the positions in which the holes h are formed. Thus, an electrical flow is blocked in the corresponding positions in which the holes h are formed, and The first electrode pad 37 and the first electrode extensions 37a are located on the second conductive-type semiconductor layer 29 of the light emitting structure 30, as shown in FIG. 22, and the first electrode extensions 37a extend from the first electrode pad 37, as shown in FIG. 21. In addition, as shown in FIG. 23, the first electrode pad 37 is insulated from the light emitting structure 30, and is electrically connected to the first conductive-type semiconductor layer 25 through the first electrode extensions 37a. The first electrode extensions 37a are connected to the first conductive-type semiconductor layer 25 exposed through the plurality of grooves g.

The protective insulation layer 35 is located on the light emitting structure 30 to cover the light emitting structure 30 and the transparent conductive layer 33. In addition, the protective insulation layer 35 covers sidewalls of the transparent conductive layer 33 to insulate the first electrode extensions 37a from the transparent conductive layer 33, as shown in FIG. 22, and covers sidewalls of the grooves g to insulate the second electrode extensions 39a from the second conductive-type semiconductor layer 29, as shown in FIG. 23.

The current blocking layer 31b may be interposed between the transparent conductive layer 33 and the second conductive-type semiconductor layer 29. As shown in FIG. 23, the current blocking layer 31b is restrictively located under the second electrode pad 39 and the second electrode extensions 39a, and the transparent conductive layer 33 is connected to the second conductive-type semiconductor layer 29 while covering the current blocking layer 31b. In addition, as shown in FIG. 22, when the holes h penetrating through the transparent conductive layer 33 are formed, the second electrode extensions 39a and the current blocking layer 31b may be connected to each other, and the transparent conductive layer 33 may be connected to the second conductive-type semiconductor layer 29 while covering only a portion of the current blocking layer 31b.

The current blocking layer 31b may be formed of or include an insulation material to block a current from flowing from the second electrode extensions 39a to the second conductive-type semiconductor layer 29. Therefore, the current blocking layer 31b relieves current crowding around the second electrode extensions 39a, thereby enhancing current spreading performance. Further, as shown in FIG. 22, since the transparent conductive layer 33 and the second electrode extensions 39a are insulated from each other in the positions in which the holes h are formed, the current is blocked in the positions in which the holes h are formed. Therefore, as illustrated in FIG. 21, the current may crowd between the holes h. That is, since the current is blocked in the positions in which the holes h are formed, current density in positions in which the holes h are not formed is locally maximized, such that light efficiency of the light emitting diode may be improved.

Here, as shown in FIG. 21, the holes h are formed in only the second electrode extensions 39a such that the holes h are spaced apart from each other by a predetermined interval. It is preferable that the holes h are formed in positions mismatched with positions in which the grooves g of the first electrode extensions 37a are formed. In some implementations, the holes h and the grooves g are formed on different horizontal lines from each other. In detail, since the current may be blocked in the positions in which the grooves g of the first electrode extensions 37a are formed as well as the positions in which the holes h are formed, the holes h are located to be mismatched with the grooves so as not to be formed in parallel with the position in which the grooves g of the first electrode extensions 37a are formed. Therefore, current density may be locally maximized between the grooves g of the first electrode extensions 37a and the holes h of the second electrode extensions 39a.

In addition, the holes h may be formed to have a length L so that the holes h are not overlapped with positions of the grooves g formed in the first electrode extensions 37a in order to maximize the current crowding between the holes h. In some implementations, the holes h may be formed to have a width W greater than that of the second electrode extensions 39a and smaller than that of a current blocking part, thereby making it possible to allow the transparent conductive layer 33 to be insulated from the second electrode extensions 39a while covering a portion of the current blocking part.

In addition, as shown in FIG. 22, the holes h may be formed to have a depth that penetrates through the transparent conductive layer 33 and the protective insulation layer 35 so that the current blocking layer 31b may be exposed. That is, the holes h are not formed up to a depth of the light emitting structure 30 unlike the grooves g, and may be formed at a depth enough to expose the current blocking layer 31b of the first electrode extensions 37a.

Figure 24:
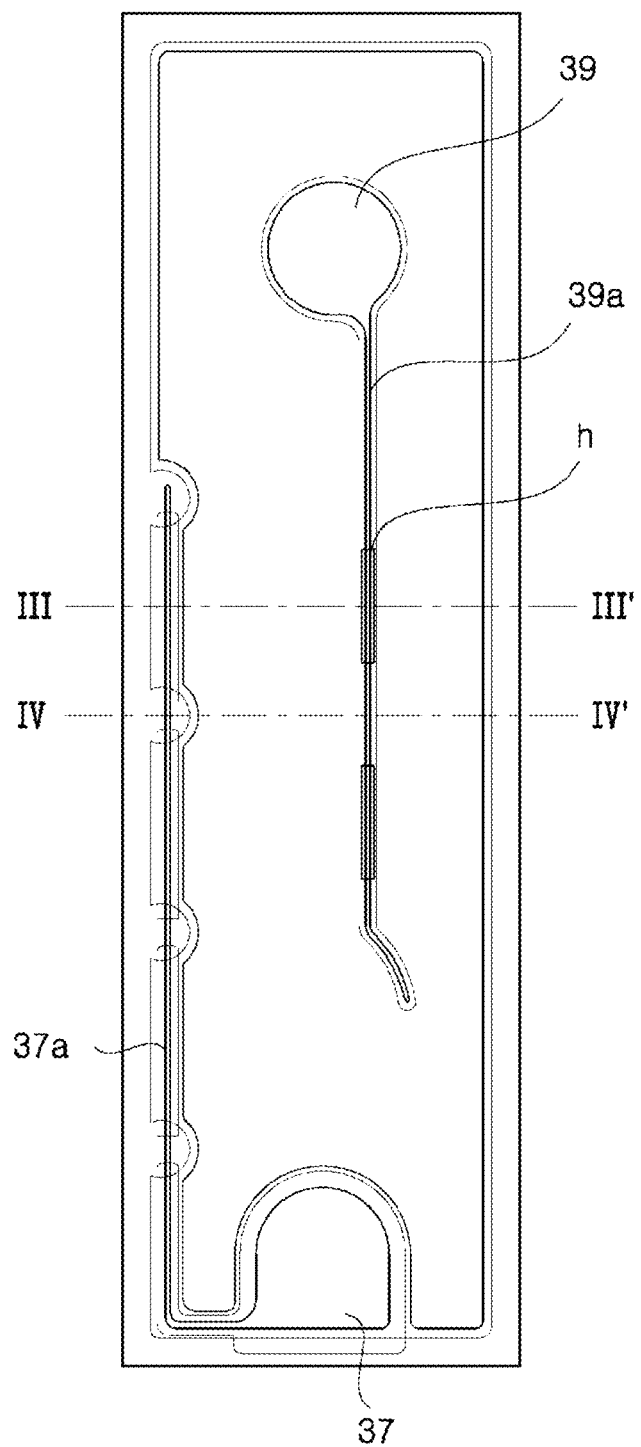
FIG. 24 is a plan view showing a light emitting diode according to yet another exemplary embodiment of the present invention.
Figure 25:
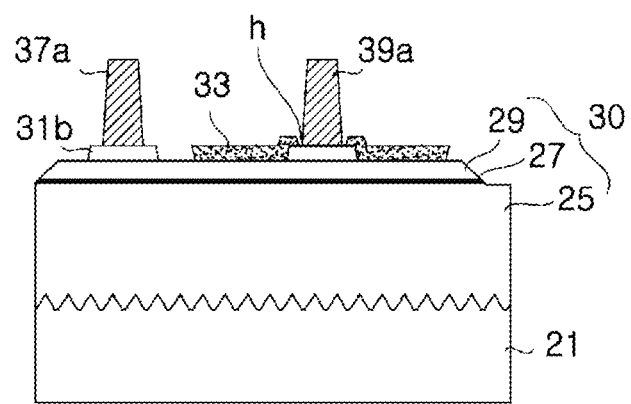
FIG. 25 is a cross-sectional view taken along line III-III' of FIG. 24.
Figure 26:
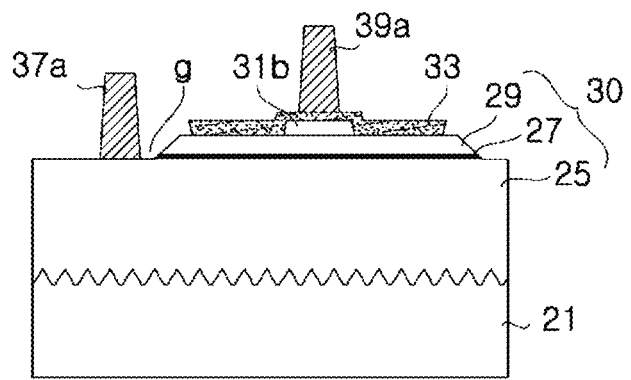
FIG. 26 is a cross-sectional view taken along line IV-IV' of FIG. 24.

FIG. 24 is a plan view showing a light emitting diode according to yet another exemplary embodiment of the disclosed technology, FIG. 25 is a cross-sectional view taken along line III-III' of FIG. 24, and FIG. 26 is a cross-sectional view taken along line IV-IV' of FIG. 24.

The light emitting diode according to yet another exemplary embodiment of the disclosed technology includes a substrate 21, a first conductive-type semiconductor layer 25, an active layer 27, a second conductive-type semiconductor layer 29, a current blocking layer 31b, a transparent conductive layer 33, a first electrode pad 37, a second electrode pad 39, first electrode extensions 37a, and second electrode extensions 39a. In addition, the same description as that of yet another exemplary embodiment of FIG. 21 will be omitted in the descriptions of the light emitting diode according to yet another exemplary embodiment of the disclosed technology.

The first and second electrode pads 37 and 39 of the light emitting diode according to yet another exemplary embodiment of the disclosed technology are located above the light emitting structure 30, a first electrode extension 37a extends from the first electrode pad 37 along an edge of the light emitting diode, and a second electrode extension 39a extends from the second electrode pad 39 toward the first electrode pad 37. Here, the first electrode extension 37a and the second electrode extension 39a may extend in parallel with each other so as to be opposite to each other.

In addition, grooves g are formed in the first electrode extension 37a so that the first electrode extension 37a may directly contact the first conductive-type semiconductor layer 25, as shown in FIG. 26, and holes h are formed in the second electrode extension 39a so that the first electrode extension 37a may direct contact the current blocking layer 31b, as shown in FIG. 25.

Here, the grooves g and the holes h are formed in positions mismatched with each other, respectively, as shown in FIG. 24. The holes h are formed not to be overlapped with positions of the grooves g.

Although the protective insulation layer is not shown in FIGS. 25 and 26 in yet another exemplary embodiment of the disclosed technology, the protective insulation layer may be formed to cover the light emitting structure 30 and the transparent conductive layer 33. For example, when the first electrode extension 37a is formed in the hole h penetrating through the transparent conductive layer 33 in FIG. 25, the insulation layer may cover the transparent conducive layer 33 so that the transparent conductive layer 33 and the first electrode extension 37a may be electrically insulated from each other.

According to the some implementations of the disclosed technology, one or more holes are formed in the second electrode extension extending from the second electrode pad to allow the current to be blocked in the positions in which the holes are formed, such that the current crowding at the positions in which the holes are not formed may be maximized, thereby making it possible to improve the light efficiency of the light emitting diode.

Although the invention has been illustrated with reference to some exemplary embodiments in conjunction with the drawings, it will be apparent to those skilled in the art that various modifications and changes can be made to the invention without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention covers the modifications and variations provided they fall within the scope of the appended claims and their equivalents.

The invention claimed is:

1. A light emitting diode device comprising:
   a substrate;
   a light emitting structure disposed over the substrate and including a first semiconductor layer, a second semiconductor layer, and an active layer disposed between the first semiconductor layer and the second semiconductor layer;
   a first electrode pad disposed over the first semiconductor layer;
   a conductive layer disposed over the second semiconductor layer;
   a second electrode pad disposed over the conductive layer; and
   a first electrode extension extending from the first electrode pad,
   wherein the first electrode extension includes first linear portions in contact with the first semiconductor layer and second linear portions not in contact with the first semiconductor layer, wherein one of the first linear portions and one of the second linear portions are alternately disposed along an edge of the second semiconductor layer,
   wherein the first electrode extension further includes third linear portions in contact with the first semiconductor layer and fourth linear portions not in contact with the first semiconductor layer, wherein one of the third linear portions and one of the fourth linear portions are alternately disposed, wherein the first, second, third, and fourth linear portions are linear when seen in plan view,
   wherein the first linear portions extend along the edge of the substrate and the third linear portions are surrounded by the second semiconductor layer, and
   wherein the first linear portions and the third linear portions are disposed along linear grooves formed on the first semiconductor layer.

2. The light emitting diode of claim 1, further comprising a protective insulation layer covering the conductive layer.

3. The light emitting diode of claim 1, further comprising:
   a first plurality of insulation layers disposed between the first semiconductor layer and the second portions of the first electrode extension.

4. The light emitting diode of claim 3, further comprising a second plurality of insulation layers disposed between the second semiconductor layer and the fourth portions of the first electrode extension.

5. The light emitting diode of claim 3, wherein the first plurality of insulation layers is disposed along the first electrode extension.

6. The light emitting diode of claim 3, wherein a width of one of the first plurality of insulation layers is greater than a width of the first electrode extension.

7. The light emitting diode device of claim 3, wherein the first electrode extension is formed along an edge of the light emitting diode device.

8. The light emitting diode device of claim 1, wherein the conductive layer includes a metal oxide.

9. The light emitting diode device of claim 1, wherein the substrate includes a sapphire substrate.

10. The light emitting diode device of claim 1, further comprising a second electrode extension extending from the second electrode pad, wherein the second electrode extension includes a plurality of portions extending from the second electrode pad.

11. The light emitting diode device of claim 1, further comprising a current blocking layer that is arranged under the second electrode pad.

12. The light emitting diode device of claim 1, wherein the conductive layer has a recess region corresponding to one of the first portions of the first electrode extension.

13. The light emitting diode device of claim 12, wherein the recess region is located between the second portions of the first electrode extension.

14. The light emitting diode device of claim 1, wherein the first electrode extension having the third portions and the fourth portions is elongated in a first direction toward the second electrode pad.

15. The light emitting diode device of claim 14, wherein the first electrode extension having the first portions and the second portions further extends in a second direction different from the first direction.

16. The light emitting diode device of claim 15, wherein the first electrode extension having the first portions and the second portions is connected to the first electrode extension having the third portions and the fourth portions.

17. The light emitting diode device of claim 3, wherein one of the first plurality of insulation layers is elongated in a longitudinal direction.

18. The light emitting diode device of claim 10, wherein the second electrode extension extends from the second electrode pad toward the first electrode pad and has a curved shape near the second electrode pad.

19. The light emitting diode device of claim 11, wherein the current blocking layer includes a distributed Bragg reflector.

* * * * *